(12) United States Patent
Schubert et al.

(10) Patent No.: US 10,347,614 B2
(45) Date of Patent: Jul. 9, 2019

(54) SOLID STATE TRANSDUCERS WITH STATE DETECTION, AND ASSOCIATED SYSTEMS AND METHODS

(71) Applicant: Micron Technology, Inc., Boise, ID (US)

(72) Inventors: Martin F. Schubert, Boise, ID (US); Vladimir Odnoblyudov, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 41 days.

(21) Appl. No.: 15/342,495

(22) Filed: Nov. 3, 2016

(65) Prior Publication Data

US 2017/0125390 A1   May 4, 2017

Related U.S. Application Data

(63) Continuation of application No. 13/223,136, filed on Aug. 31, 2011, now Pat. No. 9,490,239.

(51) Int. Cl.
*H01L 31/12* (2006.01)
*H01L 25/16* (2006.01)
(Continued)

(52) U.S. Cl.
CPC ........ *H01L 25/167* (2013.01); *H01L 27/0255* (2013.01); *H01L 33/06* (2013.01);
(Continued)

(58) Field of Classification Search
CPC ............. H01L 25/167; H01L 2924/181; H01L 2924/12041; H01L 31/173; H01L 25/0753
See application file for complete search history.

(56) References Cited

U.S. PATENT DOCUMENTS 3,851,291 A   11/1974 Sommer
4,588,883 A   5/1986 Abbas
(Continued)

FOREIGN PATENT DOCUMENTS

CN   101032034 A   9/2007
CN   101499511 A   8/2009
(Continued)

OTHER PUBLICATIONS

Office Action dated Aug. 21, 2014 in Taiwan Patent Application No. 101131066, 16 pages.
(Continued)

*Primary Examiner* — Bradley Smith
*Assistant Examiner* — David J Goodwin
(74) *Attorney, Agent, or Firm* — Perkins Coie LLP

(57) ABSTRACT

Solid state transducers with state detection, and associated systems and methods are disclosed. A solid state transducer system in accordance with a particular embodiment includes a support substrate and a solid state emitter carried by the support substrate. The solid state emitter can include a first semiconductor component, a second semiconductor component, and an active region between the first and second semiconductor components. The system can further include a state device carried by the support substrate and positioned to detect a state of the solid state emitter and/or an electrical path of which the solid state emitter forms a part. The state device can be formed from at least one state-sensing component having a composition different than that of the first semiconductor component, the second semiconductor component, and the active region. The state device and the solid state emitter can be stacked along a common axis. In further particular embodiments, the state-sensing component can include an electrostatic discharge protection device, a thermal sensor, or a photosensor.

10 Claims, 18 Drawing Sheets

(51) Int. Cl.
| | |
|---|---|
| *H05B 33/08* | (2006.01) |
| *H01L 27/02* | (2006.01) |
| *H01L 33/06* | (2010.01) |
| *H01L 33/32* | (2010.01) |
| *H01L 33/62* | (2010.01) |
| *H05B 37/02* | (2006.01) |
| *H01L 33/00* | (2010.01) |

(52) U.S. Cl.
CPC ............. *H01L 33/32* (2013.01); *H01L 33/62* (2013.01); *H05B 33/0893* (2013.01); *H05B 37/0227* (2013.01); *H01L 27/0248* (2013.01); *H01L 33/00* (2013.01); *H01L 2924/0002* (2013.01); *Y02B 20/341* (2013.01)

(56) References Cited

U.S. PATENT DOCUMENTS

| | | | |
|---|---|---|---|
| 4,766,471 | A * | 8/1988 | Ovshinsky .......... H01L 29/7391 250/551 |
| 4,967,141 | A | 10/1990 | Kiguchi et al. |
| 4,967,241 | A | 10/1990 | Kinoshita et al. |
| 5,140,152 | A * | 8/1992 | Van Zeghbroeck ........................ G02B 6/4246 250/214 A |
| 5,216,404 | A | 6/1993 | Nagai et al. |
| 5,914,501 | A | 6/1999 | Antle et al. |
| 5,917,534 | A | 6/1999 | Rajeswaran |
| 6,784,413 | B2 | 8/2004 | Sasaki et al. |
| 7,064,353 | B2 | 6/2006 | Bhat |
| 7,459,726 | B2 * | 12/2008 | Kato ................... H01L 21/8221 257/82 |
| 7,518,422 | B2 | 4/2009 | Johnson et al. |
| 7,528,422 | B2 | 5/2009 | Murphy |
| 7,589,350 | B2 | 9/2009 | Chen et al. |
| 7,649,208 | B2 | 1/2010 | Lee et al. |
| 7,683,383 | B2 | 3/2010 | Hong et al. |
| 7,706,421 | B2 | 4/2010 | Hosking |
| 7,714,348 | B2 | 5/2010 | Fan et al. |
| 8,169,046 | B2 | 5/2012 | Chen |
| 8,278,669 | B2 | 10/2012 | Kim et al. |
| 8,587,018 | B2 | 11/2013 | Kao et al. |
| 2001/0021208 | A1 | 9/2001 | Ueyanagi |
| 2005/0088102 | A1 * | 4/2005 | Ferguson ........... H05B 41/2856 315/149 |
| 2006/0006404 | A1 | 1/2006 | Ibbetson et al. |
| 2006/0081857 | A1 | 4/2006 | Hong et al. |
| 2006/0192084 | A1 * | 8/2006 | Lee ...................... H01L 25/167 250/214.1 |
| 2006/0202914 | A1 | 9/2006 | Ashdown |
| 2007/0069218 | A1 | 3/2007 | Chen et al. |
| 2007/0120133 | A1 * | 5/2007 | Koda ............. H01L 31/022408 257/80 |
| 2007/0170450 | A1 | 7/2007 | Murphy |
| 2008/0251794 | A1 | 10/2008 | Koda et al. |
| 2008/0308823 | A1 | 12/2008 | Kamii et al. |
| 2009/0272994 | A1 * | 11/2009 | Lim ...................... H01L 33/382 257/97 |
| 2010/0019264 | A1 | 1/2010 | Jeong |
| 2010/0038672 | A1 | 2/2010 | Park et al. |
| 2010/0109022 | A1 | 5/2010 | Kim et al. |
| 2010/0155746 | A1 | 6/2010 | Ibbetson et al. |
| 2010/0207127 | A1 * | 8/2010 | Chen ...................... G01K 7/183 257/79 |
| 2010/0267176 | A1 | 10/2010 | Liu et al. |
| 2010/0295087 | A1 | 11/2010 | Baek et al. |
| 2011/0198621 | A1 | 8/2011 | Choi et al. |
| 2011/0260205 | A1 | 10/2011 | Moosburger et al. |
| 2011/0266559 | A1 * | 11/2011 | Zitzlsperger .............. G01V 8/12 257/84 |
| 2012/0049214 | A1 | 3/2012 | Lowes et al. |
| 2012/0138999 | A1 * | 6/2012 | Okabe .................. H01L 33/405 257/98 |
| 2013/0049020 | A1 | 2/2013 | Schubert et al. |
| 2013/0049059 | A1 | 2/2013 | Odnoblyudov et al. |

FOREIGN PATENT DOCUMENTS

| | | |
|---|---|---|
| CN | 101859758 A | 10/2010 |
| CN | 102106007 A | 6/2011 |
| EP | 1601019 A2 | 11/2005 |
| EP | 2355177 A2 | 8/2011 |
| JP | S61220383 A | 9/1986 |
| JP | S62188386 A | 8/1987 |
| JP | H08162669 A | 6/1996 |
| JP | 2006228904 A | 8/2006 |
| JP | 2006339629 A | 12/2006 |
| JP | 2007201317 A | 8/2007 |
| JP | 2008258270 A | 10/2008 |
| JP | 2010524226 A | 7/2010 |
| JP | 2010192871 A | 9/2010 |
| KR | 20100011116 | 2/2010 |
| KR | 1020100011116 A | 2/2010 |
| WO | 2005055379 A1 | 6/2005 |
| WO | 2008088165 A1 | 7/2008 |
| WO | 2010060404 A1 | 6/2010 |
| WO | 2010099647 | 9/2010 |

OTHER PUBLICATIONS

Office Action dated Oct. 20, 2015 in Japan Application No. 2014-528427, 8 pages.

Atwater Jr., H.A., Ion Beam Enhanced Grain Growth in Thin Films, RLE Technical Report No. 527, Massachusetts Institute of Technology, Research Laboratory of Electronics, pp. 1-224, Mar. 1987.

Atwater, H.A. et al., Mechanisms for Crystallographic Orientation in the Crystallization of Thin Silicon Films from the Melt, J. Mater. Res., vol. 3, No. 6, pp. 1232-1237, Nov./Dec. 1988.

Atwater, H.A. et al., Zone-Melting Recrystallization of Thick Silicon on Insulator Films, Materials Letters, vol. 2, No. 4A, pp. 269-273, Mar. 1984.

Burgi, L. et al., "Integrated Optical Proximity Sensor Based on Organic Photodiodes and organic LEDs", Proc. SPIE 5961, 596104 (2005), doi:10.1117/12.628140.

Choi, J.-H. et al. Zone Melting Recrystallization of Polysilicon by a Focused-Lamp with Unsymmetric Trapezoidal Power Distribution, Journal of Electronic Materials, vol. 20, No. 3, pp. 231-235, Mar. 1991.

Colinge, J.-P., Silicon-on-Insulator Technology: Materials to VLSI, 2nd Edition, pp. 16-27 and 52-65, Sep. 1997.

Extended European Search Report in European Application No. 12827519.5, dated Apr. 16, 2015, 6 pages.

Extended European Search Report dated Apr. 30, 2015 in European Application No. 12828253.0, 7 pages.

Geis, M.W. et al., (Invited) Silicon Graphoepitaxy, Proceedings of the 12th Conference on Solid State Devices, Tokyo 1980, Japanese Journal of Applied Physics, vol. 20, Supplement 20-1, pp. 39-42, 1981.

Geis, M.W. et al., Grapho-Epitaxy of Silicon on Fused Silica using Surface Micropatterns and Laser Crystallization, J. Vac. Sci. Technol., vol. 16, No. 6, pp. 1640-1643, Nov./Dec. 1979.

Geis, M.W. et al., Summary Abstract: Silicon Graphoepitaxy, J. Vac. Sci. Technol., vol. 18, No. 2, pp. 229-230, Mar. 1981.

Geis, M.W. et al., Zone-Melting Recrystallization of Si Films with a Moveable-Strip-Heater Oven, J. Electrochem. Soc.: Solid State Science and Technology, vol. 129, No. 12, pp. 2812-2818, Dec. 1982.

Givargizov, E.I., Graphoepitaxy as an Approach to Oriented Crystallization on Amorphous Substrates, Journal of Crystal Growth, vol. 310, No. 7-9, pp. 1686-1690, Apr. 2008.

International Search Report and Written Opinion dated Feb. 28, 2013 in International Application No. PCT/US2012/050855, 13 pages.

International Search Report and Written Opinion dated Feb. 28, 2013 in International Application No. PCT/US2012/050866, 8 pages.

Klykov, V.I. et al. Artificial Epitaxy (Diataxy) of Silicon and Germanium, Acta Physica Academiae Scientiarum Hungaricae, vol. 47, Nos. 1-3, pp. 167-183, Mar. 1979.

(56) References Cited

OTHER PUBLICATIONS

Minagawa, Y. et al. Fabrication of (111)-Oriented Si Film with a Ni/Ti Layer by Metal Induced Crystallization, Jpn. J. Appl. Phys., vol. 20, Part 2, No. 3A, pp. L186-L188, Mar. 2001.
Moon, B.Y. et al. Study on the Polycrystalline Silicon Films Deposited by Inductively Coupled Plasma Chemical Vapor Deposition, Mat. Res. Soc. Symp. Proc., vol. 685E, pp. D5.2.1-D5.2.6, 2001.
Moridi, M. et al., "An Amorphous Silicon Photodiode Array for Glass-Based Optical MEMS Application", IEEE Sensors 2009, pp. 1604-1608, Oct. 2009, doi:10.1109/ICSENS.2009.5398496.
Nanotechweb.org, Nanoparticle Film Turns LED into Portable Ozone Sensor, 2 pages, Oct. 11, 2007, retrieved from the Internet, URL: http://nanotechweb.org/cws/article/tech/31446.
Naomoto, H. et al., Characterization of Thin-Film Silicon Formed by High-Speed Zone-Melting Recrystallization Process, Solar Energy Materials and Solar Cells, vol. 48, Nos. 1-4, pp. 261-267, Nov. 1997.
Office Action dated Apr. 19, 2015 in Korean Patent Application No. 10-2014-7006476, 8 pages.
Office Action dated Apr. 24, 2015 in Korean Patent Application No. 10-2014-7007237, 16 pages.
Office Action dated Dec. 28, 2015 in Korea Application No. 10-2014-7006476, 8 pages.
Office Action dated May 27, 2016 in China Application No. 201280042116.0, 15 pages.
Office Action dated Oct. 21, 2015 in China Application No. 201280042116.0, 28 pages.
Office Action dated Oct. 22, 2014 in Taiwan Patent Application No. 101130698, 7 pages.
Office Action dated Oct. 28, 2015 in China Application No. 201280042001.1, 15 pages.
Pauli, M. et al., Large Area and Rapid Thermal Zone Melting Crystallization of Silicon Films on Graphite Substrates for Photovoltaic Use, Conference Record of the 23rd IEEE Photovoltaic Specialists Conference, pp. 195-200, May 1993.
Sato, Y. et al., "A Method of Preparing Thin-Film Micro-Ptc Thermistors Based on BaTiO3 Using YAG-Laser Irradiation", Electronics and Communications in Japan, Part 2, vol. 85, No. 11, pp. 25-31, Nov. 2002, doi:10.1002/ecjb.1113.
Scharff, W. et al., Flash-Lamp-Induced Crystal Growth of Silicon on Amorphous Substrates Using Artificial Surface-Relief Structures, Physica Status Solidi (a), vol. 74, No. 2, pp. 545-552, Dec. 1982.
Urban, G. et al., "High-Resolution Thin-Film Temperature Sensor Arrays for Medical Applications", Sensors and Actuators A: Physical, vol. 22, Nos. 1-3, pp. 650-654, Jun. 1989, doi:10.1016/0924-4247(89)80051-2.
Wan, J. et al., Growth of Crack-Free Hexagonal GaN Films on Si(100), Applied Physics Letters, vol. 79, No. 10, pp. 1459-1461, Sep. 2001.
Wang, X.X. et al., "All-Thin-Film GeAu Thermistors for Particle Detection", Journal of Low Temperature Physics, vol. 93, Nos. 3-4, pp. 349-354, Nov. 1993, doi:10.1007/BF00693445.
Wronski, C.R. And D.E. Carlson, "Surface States and Barrier Heights of Metal-Amorphous Silicon Schottky Barriers", Solid State Communications, vol. 23, No. 7, pp. 421-424, Aug. 1977, doi:10.1016/0038-1098(77)90999-1.
Yoon, S.M. et al., Numerical Simulation of Scanning Speed and Supercooling Effects During Zone-Melting-Recrystallization of SOI Wafers, Mat. Res. Soc. Symp. Proc., vol. 205, pp. 453-458, 1990.
European Patent Application No. 12828253.0—European Office Action, dated May 3, 2017, 4 pages.

\* cited by examiner

SOLID STATE TRANSDUCERS WITH STATE DETECTION, AND ASSOCIATED SYSTEMS AND METHODS

CROSS-REFERENCE TO RELATED APPLICATIONS

This application is a continuation of U.S. application Ser. No. 13/223,136, filed Aug. 31, 2011, now U.S. Pat. No. 9,490,239, which is incorporated herein by reference in its entirety.

TECHNICAL FIELD

The present technology is directed generally to solid state transducers ("SSTs" including transducers having integrated state detection devices and functions, and associated systems and methods.

BACKGROUND

Solid state lighting ("SSL") devices are used in a wide variety of products and applications. For example, mobile phones, personal digital assistants ("PDAs"), digital cameras, MP3 players, and other portable electronic devices utilize SSL devices for backlighting. SSL devices are also used for signage, indoor lighting, outdoor lighting, and other types of general illumination. SSL devices generally use light emitting diodes ("LEDs"), organic light emitting diodes ("OLEDs"), and/or polymer light emitting diodes ("PLEDs") as sources of illumination, rather than electrical filaments, plasma, or gas. FIG. 1A is a cross-sectional view of a conventional SSL device 10a with lateral contacts. As shown in FIG. 1A, the SSL device 10a includes a substrate 20 carrying an LED structure 11 having an active region 14, e.g., containing gallium nitride/indium gallium nitride (GaN/InGaN) multiple quantum wells ("MQWs"), positioned between N-type GaN 15 and P-type GaN 16. The SSL device 10a also includes a first contact 17 on the P-type GaN 16 and a second contact 19 on the N-type GaN 15. The first contact 17 typically includes a transparent and conductive material (e.g., indium tin oxide ("ITO")) to allow light to escape from the LED structure 11. In operation, electrical power is provided to the SSL device 10a via the contacts 17, 19, causing the active region 14 to emit light.

FIG. 1B is a cross-sectional view of another conventional LED device 10b in which the first and second contacts 17 and 19 are opposite each other, e.g., in a vertical rather than lateral configuration. During formation of the LED device 10b, a growth substrate, similar to the substrate 20 shown in FIG. 1A, initially carries an N-type GaN 15, an active region 14 and a P-type GaN 16. The first contact 17 is disposed on the P-type GaN 16, and a carrier 21 is attached to the first contact 17. The substrate is removed, allowing the second contact 19 to be disposed on the N-type GaN 15. The structure is then inverted to produce the orientation shown in FIG. 1B. In the LED device 10b, the first contact 17 typically includes a reflective and conductive material (e.g., silver or aluminum) to direct light toward the N-type GaN 15.

One aspect of the LEDs shown in FIGS. 1A and 1B is that an electrostatic discharge ("ESD") event can cause catastrophic damage to the LED, and render the LED inoperable. Accordingly, it is desirable to reduce the effects of ESD events. However, conventional approaches for mitigating the effects of ESD typically include connecting a protection diode to the SST device, which requires additional connection steps and can compromise the electrical integrity of the resulting structure. Another aspect of the LEDs shown in FIGS. 1A and 1B is that the performance levels of the devices may vary due to internal heating, drive current, device age and/or environmental effects. Accordingly, there remains a need for reliably and cost-effectively manufacturing LEDs with suitable protection against ESD and other performance-degrading factors.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. Moreover, in the drawings, like reference numerals designate corresponding parts throughout the several views and/or embodiments.

DETAILED DESCRIPTION

Figure 1A:
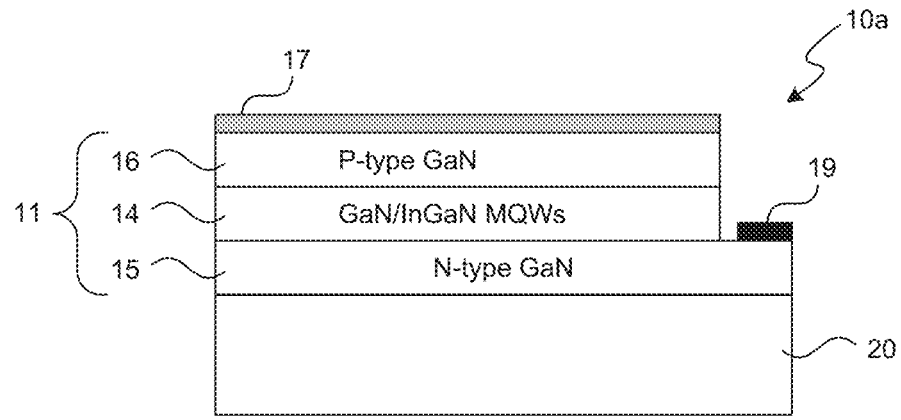
FIG. 1A is a partially schematic, cross-sectional illustration of an SSL device having a lateral arrangement in accordance with the prior art.
Figure 1B:
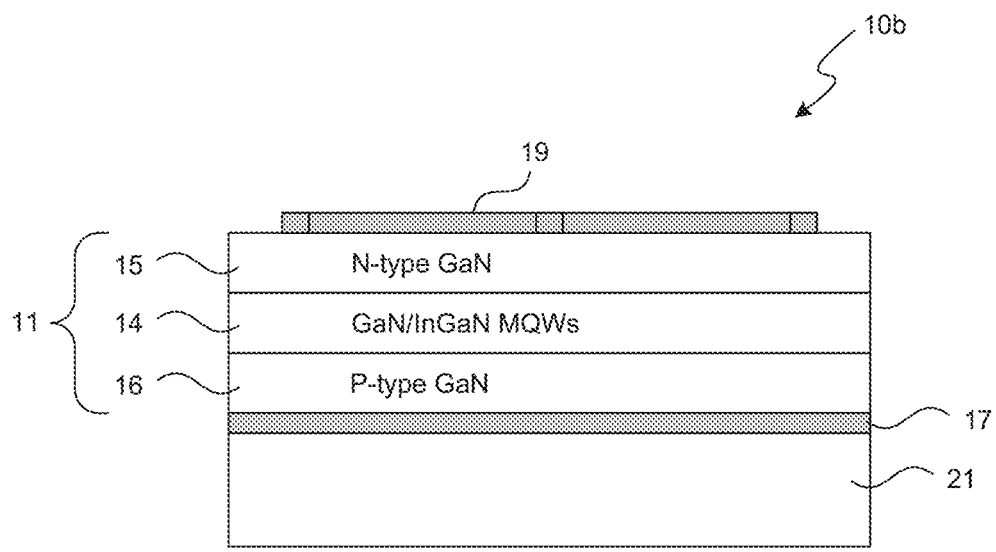
FIG. 1B is a partially schematic, cross-sectional illustration of another SSL device having a vertical arrangement in accordance with the prior art.

Specific details of several embodiments of representative SST devices and associated methods of manufacturing SST devices are described below. The term "SST" generally refers to solid-state transducer devices that include a semiconductor material as the active medium to convert electrical energy into electromagnetic radiation in the visible, ultraviolet, infrared, and/or other spectra. For example, SSTs include solid-state light emitters (e.g., LEDs, laser diodes, etc.) and/or other sources of emission other than electrical filaments, plasmas, or gases. In other embodiments, SSTs can include solid-state devices that convert electromagnetic radiation into electricity. The term solid state emitter ("SSE") generally refers to the solid state components or light emitting structures that convert electrical energy into electromagnetic radiation in the visible, ultraviolet, infrared, and/or other spectra. SSEs include semiconductor LEDs, PLEDs, OLEDs, and/or other types of solid state devices that convert electrical energy into electromagnetic radiation in a desired spectrum. A person skilled in the relevant art will understand that the new, presently disclosed technology may have additional embodiments and that this technology may be practiced without several of the details of the embodiments described below with reference to FIGS. 2A-9.

Reference herein to "one embodiment", "an embodiment", or similar formulations, means that a particular feature, structure, operation, or characteristic described in connection with the embodiment, is included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

In particular embodiments, a solid state transducer system includes a support substrate and a solid state emitter carried by the support substrate. The solid state emitter can comprise a first semiconductor component, a second semiconductor component, and an active region between first and second semiconductor components. The system further includes a state device carried by the support substrate and positioned to detect a state of the solid state emitter and/or an electrical path of which the solid state emitter forms a part. The state device is formed from at least one state-sensing component having a composition different than that of the first semiconductor component, the second semiconductor component, and the active region. The state device and the solid state emitter can be stacked along a common axis. For example, in particular embodiments, the state device can include an electrostatic discharge protection device, a photosensor, or a thermal sensor. The state device can be formed integrally with the solid state emitter, using (in at least some embodiments) a portion of the same epitaxial growth substrate used to form the SSE. The state device can be formed above or below the stacking axis of the solid state emitter, directly along the axis, or off the axis, depending upon the particular embodiment.

Figure 2A:
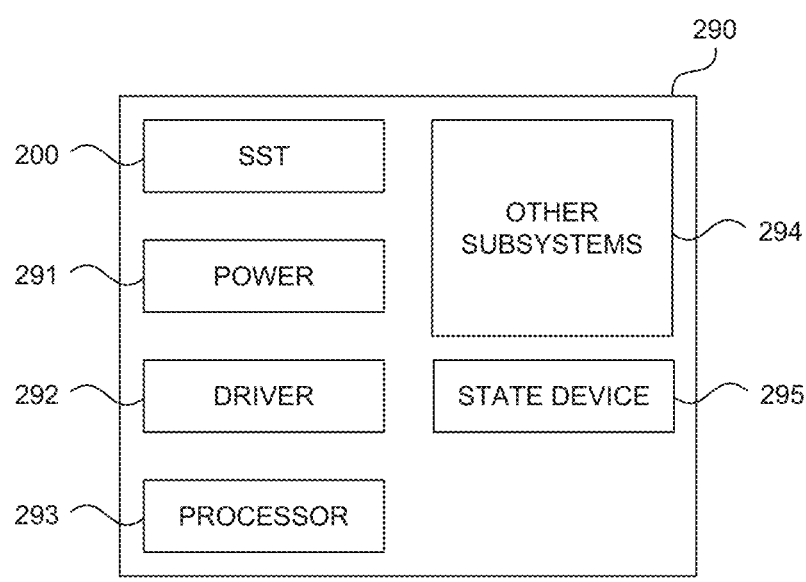
FIG. 2A is a schematic block diagram of a system configured in accordance with an embodiment of the presently disclosed technology.

FIG. 2A is a schematic illustration of a representative system 290. The system 290 can include an SST device 200, a power source 291, a driver 292, a processor 293, and/or other subsystems or components 294. The resulting system 290 can perform any of a wide variety of functions, such as backlighting, general illumination, power generation, sensing, and/or other functions. Accordingly, representative systems 290 can include, without limitation, hand-held devices (e.g., cellular or mobile phones, tablets, digital readers, and digital audio players), lasers, photovoltaic cells, remote controls, computers, lights and lighting systems, and appliances (e.g., refrigerators, for example). Components of the system 290 may be housed in a single unit or distributed over multiple, interconnected units (e.g., through a communications network). The components of the system 290 can also include local and/or remote memory storage devices, and any of a wide variety of computer-readable media.

In many instances, it is desirable to monitor the performance of the SST device 200 and/or the environment in which the SST device 200 operates, and make appropriate adjustments. For example, if the SST device 200 is subjected to an excessive voltage (e.g., an electrostatic discharge or "ESD"), it is desirable to protect the device with a diode or other non-linear circuit component. If the SST device 200 approaches an overheat condition, it may be desirable to reduce the current supplied to the device until the device cools down. If the SST device 200 includes a solid state lighting (SSL) device, and the light emitted by the device does not meet target emission specifications, it may be desirable to adjust the output of the device. In each of these representative examples, the system 290 can includes a state monitor or device 295 that monitors a state of the SST device 200, and participates in or facilitates a response. In some cases the state monitor 295 can act directly to provide a response. For example, a diode wired in parallel with the SST device 200 can respond directly to a high voltage by closing, causing the current to bypass the SST device 200. In other embodiments, the state monitor 295 can respond with the assistance of another device, e.g., the processor 293. For example, if the state monitor 295 is a photosensor, it can provide a signal to the processor 293 corresponding to a warmth, color and/or other characteristic of the emitted light, and the processor 293 can issue a responsive command to change the output of the SSE. In another embodiment, the state monitor 295 includes a thermistor, and can provide to the processor 293 a signal corresponding to a high temperature condition. The processor 293 can respond by directing the SST device 200 to reduce power or cease operation until the temperature falls, in order to reduce the impact of the elevated temperature on the SST device 200.

Specific examples of state monitors that include ESD protection devices are described below with reference to FIGS. 2B-5B. Certain features of these examples are also described in co-pending U.S. application Ser. No. 13/223, 098 titled "Solid State Lighting Devices, Including Devices Having Integrated Electrostatic Discharge Protection, and Associated Systems and Methods," filed on Aug. 31, 2011, and incorporated herein by reference. Examples of state monitors that include photosensors are described below with reference to FIGS. 6-8L, and examples of state monitors that include thermal sensors (e.g., thermistors) are described below with reference to FIG. 9. In any of these embodiments, the state monitor can detect the state of the SSE (e.g., as is the case with a photosensor and a thermal sensor) and/or the state of an electrical path or circuit of which the SSE forms or part (as is the case with an ESD diode).

Figure 2B:
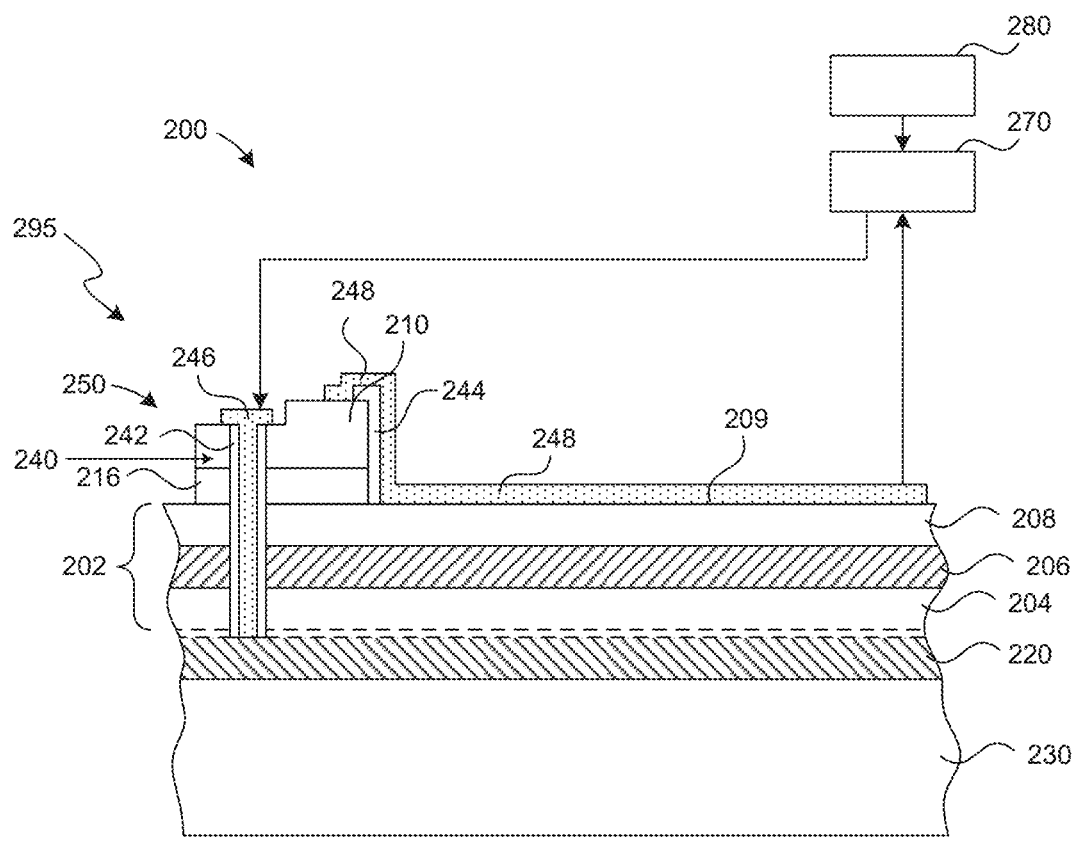
FIG. 2B is a cross-sectional view of an SST device having an electrostatic discharge device, configured and integrated in accordance with embodiments of the presently disclosed technology.

FIG. 2B is a cross-sectional view of an SST device 200 configured in accordance with embodiments of the presently disclosed technology. The SST device 200 can include an SSE 202 mounted to or otherwise carried by a support substrate 230. The SST device 200 further includes a state device or monitor 295 in the form of an electrostatic discharge device 250 carried by the SSE 202. Accordingly, the electrostatic discharge device 250 represents a specific example of a state monitor. As will be described further below, the electrostatic discharge device 250 can be manufactured to be integral with the SST device 200 (and in particular, the SSE 202) e.g., to improve system reliability, manufacturability and/or performance, and/or to reduce system size.

The SSE 202 can include a first semiconductor material 204, a second semiconductor material 208, and an active region 206 between the first and second semiconductor materials 204, 208. In one embodiment, the first semiconductor material 204 is a P-type gallium nitride ("GaN") material, the active region 206 is an indium gallium nitride ("InGaN") material, and the second semiconductor material 208 is an N-type GaN material. In other embodiments, the semiconductor materials of the SSE 202 can include at least one of gallium arsenide ("GaAs"), aluminum gallium arsenide ("AlGaAs"), gallium arsenide phosphide ("GaAsP"), aluminum gallium indium phosphide (AlGaInP), gallium(III) phosphide ("GaP"), zinc selenide ("ZnSe"), boron nitride ("BN"), aluminum nitride ("AlN"), aluminum gallium nitride ("AlGaN"), aluminum gallium indium nitride ("AlGaInN"), and/or another suitable semiconductor material.

The illustrated electrostatic discharge device 250 includes an epitaxial growth substrate 210 and a semiconductor material 216 (e.g., a buffer material). The electrostatic discharge device 250 further includes a first contact 246 (e.g., formed from a first conductive material) electrically connected to a via 240 that extends through the electrostatic discharge device 250 and through a portion of the SSE 202. The first contact 246 electrically contacts a conductive (and typically reflective) material 220 below the active region 206 and can provide an external terminal for interfacing with a power source or sink. Accordingly, the conductive material 220 operates as a P-contact. The first contact 246 is electrically insulated in the via 240 from the surrounding semiconductor material 216 and portions of the SSE 202 by an insulator 242. The illustrated electrostatic discharge device 250 further includes a second contact 248 (e.g., formed from a second conductive material) that doubles as an N-contact for the SSE 202. Accordingly, the second contact 248 can extend over an upper surface 209 of the SSE 202 e.g., in contact with the N-type material 208. The second contact 248 is electrically insulated from the semiconductor material 216 by a second insulator 244, and is transparent to allow radiation (e.g., visible light) to pass out through the external surface of the SST device 200 from the active region 206. In the illustrated embodiment, the first contact 246 and the second contact 248 are shared by the SSE 202 and the electrostatic discharge device 250. More specifically, the first contact 246 is electrically coupled to both the first semiconductor layer 204 of the SSE 202 and the epitaxial growth substrate 210 of the electrostatic discharge device 250. The second contact 248 is electrically coupled to both the second semiconductor layer 208 of the SSE 202 and the epitaxial growth substrate 210 of the electrostatic discharge device 250. Accordingly, the electrostatic discharge device 250 is connected in parallel with the SSE 202. The conductive materials forming the first contact 246, the second contact 248 and an electrical path though the via 240 can be the same or different, depending upon the particular embodiment. For example, the via 240 can include a third conductive material that is the same as the first conductive material, though it may be deposited in a separate step.

The SST device 200 can be coupled to a power source 270 that is in turn coupled to a controller 280. The power source 270 provides electrical current to the SST device 200, under the direction of the controller 280. During normal operation, as current flows from the first semiconductor material 204 to the second semiconductor material 208, charge-carriers flow from the second semiconductor material 208 toward the first semiconductor material 204 and cause the active region 206 to emit radiation. The radiation is reflected outwardly by the conductive, reflective material 220. The electrostatic discharge device 250 provides a bypass path for current to flow between the first contact 246 and the second contact 248 under high (e.g., excessive) voltage conditions. In particular, the epitaxial growth substrate 210 between the first contact 246 and the second contact 248 can form a diode in parallel with the SSE 202, but with the opposite polarity. During normal operating conditions, the bias of the epitaxial growth substrate 210 prevents current flow through it from the first contact 246 to the second contact 248, forcing the current to pass through the SSE 202. If a significant reverse voltage is placed across the contacts 246, 248, (e.g., during an electrostatic discharge event), the epitaxial growth substrate 210 becomes highly conductive in the reverse direction, allowing the reverse current to flow through it, thus protecting the SST device from the reverse current flow.

The present technology further includes methods of manufacturing SST devices. For example, one method of forming a SST device can include forming an SSE and an electrostatic discharge device from a common epitaxial growth substrate. Representative steps for such a process are described in further detail below with reference to FIGS. 3A-3G.

Figure 3A:
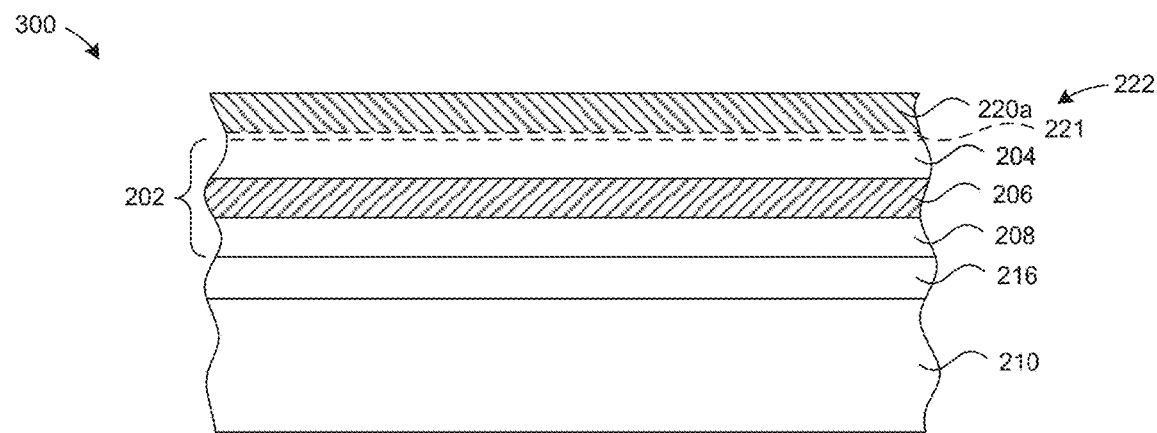
FIGS. 3A-3G are cross-sectional views of a portion of a microelectronic substrate undergoing a process for forming an SST device and an associated electrostatic discharge device in accordance with embodiments of the presently disclosed technology.

FIGS. 3A-3G are partially schematic, cross-sectional views of a portion of a microelectronic substrate 300 undergoing a process of forming an embodiment of the SST device 200 described above, in accordance with embodiments of the technology. FIG. 3A shows the substrate 300 after a semiconductor material 216 (e.g., a buffer material) has been disposed on the epitaxial growth substrate 210. The epitaxial growth substrate 210 can be silicon (e.g., Si (1,0,0) or Si (1,1,1)), GaAs, silicon carbide (SiC), polyaluminum nitride ("pAlN"), engineered substrates with silicon epitaxial surfaces (e.g., silicon on polyaluminum nitride), and/or other suitable materials. The semiconductor material 216 can be the same material as the epitaxial growth substrate 210 or a separate material bonded to the epitaxial growth substrate 210. For example, the epitaxial growth substrate 210 can be pAlN and the semiconductor material 216 can be Si (1,1,1). In any of these embodiments, the SSE 202 is formed on the semiconductor material 216.

The SSE 202 includes the first semiconductor material 204, the active region 206, and the second semiconductor material 208, which can be sequentially deposited or otherwise formed using chemical vapor deposition ("CVD"), physical vapor deposition ("PVD"), atomic layer deposition ("ALD"), plating, or other techniques known in the semiconductor fabrication arts. In the embodiment shown in FIG. 3A, the second semiconductor material 208 is grown or formed on the semiconductor material 216, the active region 206 is grown or formed on the second semiconductor material 208, and the first semiconductor material 204 is grown or formed on the active region 206. In one embodiment, N-type GaN (as described above with reference to FIG. 2B) is positioned proximate to the epitaxial growth substrate 210, but in other embodiments P-type GaN is positioned proximate to the epitaxial growth substrate 210. In any of these embodiments, the SSE 202 can include additional buffer materials, stress control materials, and/or other materials, and/or the materials can have other arrangements known in the art.

In the embodiment shown in FIG. 3A, a conductive, reflective material 220a is formed over the first semiconductor material 204. The conductive, reflective material 220a can be silver (Ag), gold (Au), gold-tin (AuSn), silver-tin (AgSn), copper (Cu), aluminum (Al), or any other suitable material that can provide electrical contact and reflect light emitted from the active region 206 back through the first semiconductor material 204, the active region 206, and the second semiconductor material 208, as described above with reference to FIG. 2B. The conductive, reflective material 220a can be selected based on its thermal conductivity, electrical conductivity, and/or the color of light it reflects. For example, silver generally does not alter the color of the reflected light. Gold, copper, or other colored reflective materials can affect the color of the light and can accordingly be selected to produce a desired color for the light emitted by the SSE 202. The conductive, reflective material 220a can be deposited directly on the first semiconductor material 204, or a transparent electrically conductive material 221 (shown in broken lines) can be disposed between the first semiconductor material 204 and the reflective material 220a. The transparent electrically-conductive material 221 can be indium tin oxide (ITO) or any other suitable material that is transparent, electrically conductive, and adheres or bonds the reflective material 220a to the first semiconductor material 204. The transparent, electrically conductive material 221 and the reflective material 220a can be deposited using CVD, PVD, ALD, plating, or other techniques known in the semiconductor fabrication arts. The transparent, electrically conductive material 221 and/or the reflective material 220a can accordingly form a conductive structure 222 adjacent to (e.g., in contact with) the SSE 202.

Figure 3B:
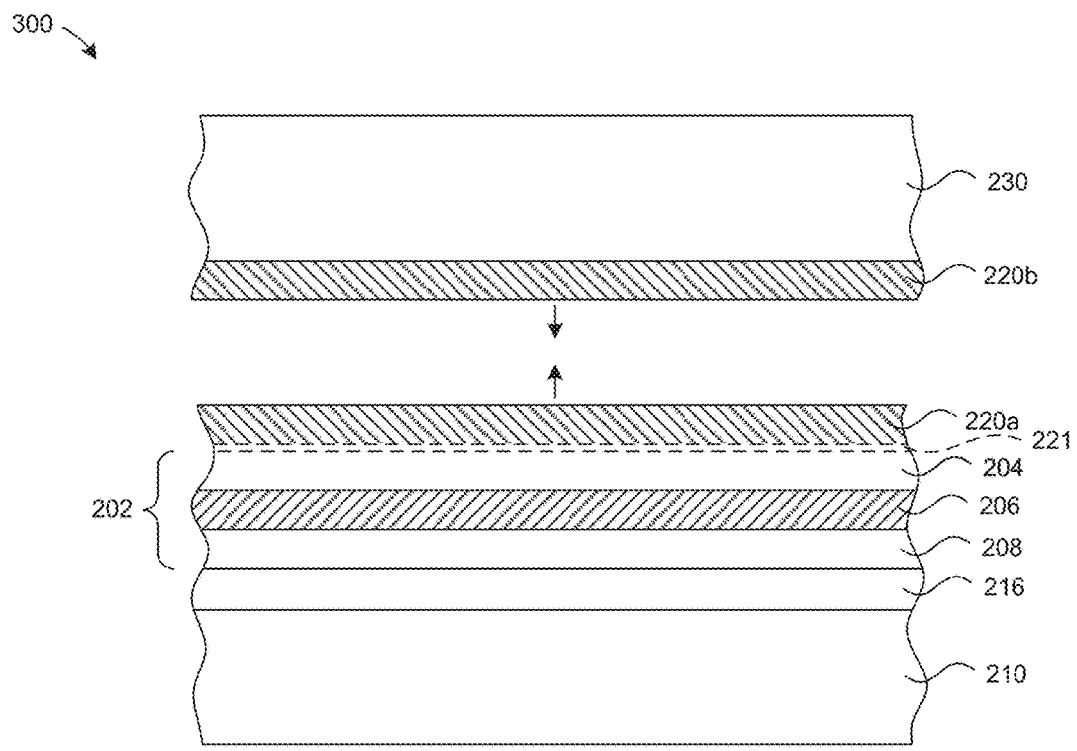

FIG. 3B illustrates an embodiment of a support substrate 230 being bonded or otherwise attached to the SSE 202. The support substrate 230 can include an optional backside reflective material 220b. The backside reflective material 220b is bonded or otherwise attached to the reflective material 220a using an elevated pressure and/or elevated temperature process.

Figure 3C:
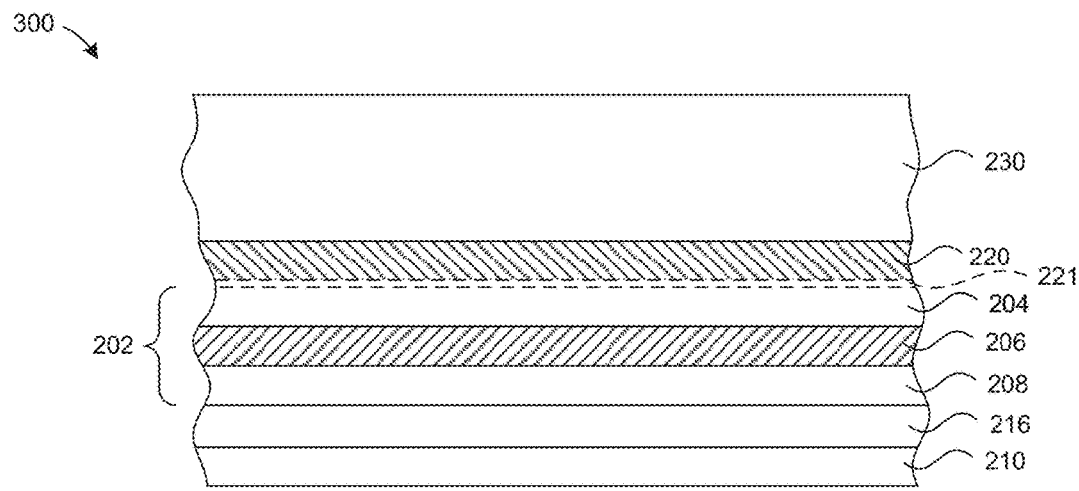

FIG. 3C shows an embodiment in which the bonded reflective materials 220a, 220b (FIG. 3B) form a combined reflective material 220. The epitaxial growth substrate 210 has also been thinned, e.g., by backgrinding. At this point, the remaining epitaxial growth substrate 210 can be implanted with a p-type dopant (e.g., boron) to form a p-n junction with the underlying silicon or other semiconductor material 216. In another embodiment, the substrate 210 can be doped in a prior step. In either embodiment, because the semiconductor material 216 typically includes buffer layers to facilitate forming the SSE 202, and because the buffer layers typically include undoped, large-bandgap semiconductor layers (e.g., GaN, AlGaN or AlN), the p-n junction will be electrically isolated from the epitaxial junction that forms the SSE 202.

Figure 3D:
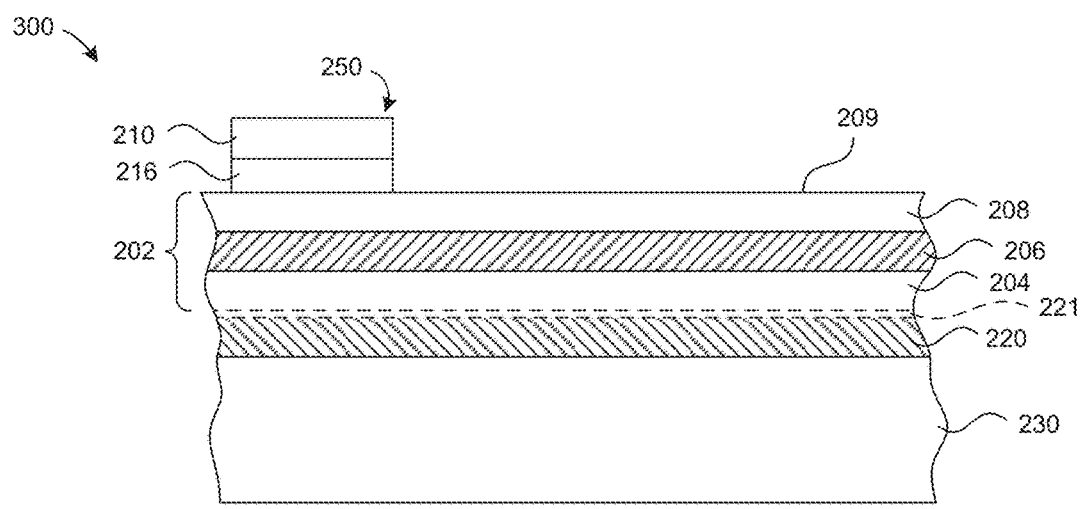

FIG. 3D illustrates the microelectronic substrate 300 after (a) the epitaxial growth substrate 210 has been background and/or etched, (b) the substrate 300 has been inverted, and (c) the epitaxial growth substrate 210 has been doped. Most of the semiconductor material 216 and the epitaxial growth substrate 210 has been removed using grinding, etching, and/or other processes to expose an outer surface 209 of the second semiconductor material 208 or other portions of the SSE 202. A portion of the semiconductor material 216 and the epitaxial growth substrate 210 remain on the SSE 202 to form the electrostatic discharge device 250. This is one manner in which the electrostatic discharge device 250 can be made integral with the SSE 202 and the SST 300. In further embodiments, the same or similar techniques can be used to form multiple electrostatic discharge devices 250 integral with the SSE 202 e.g., after the surface 209 has been selectively etched or otherwise treated.

Figure 3E:
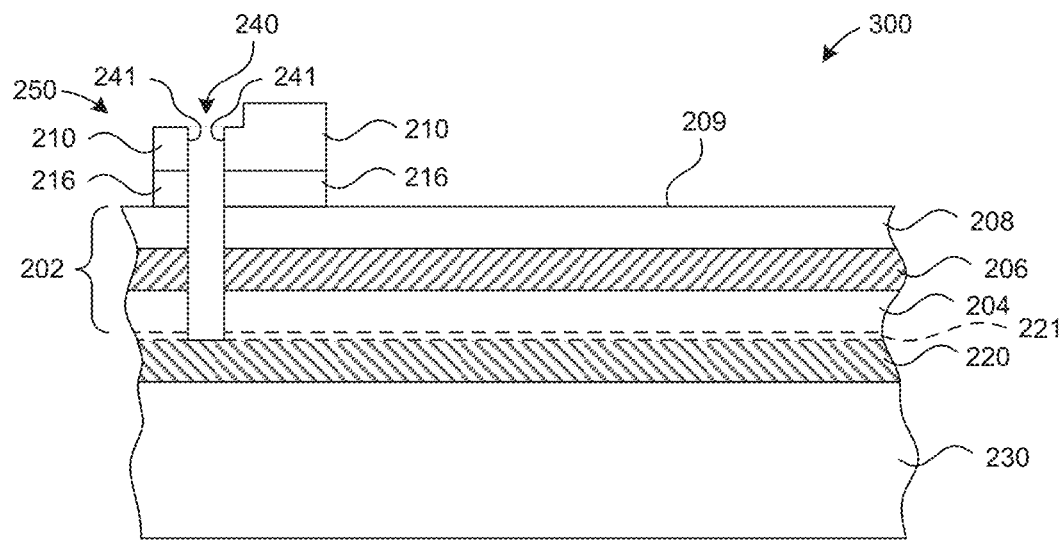
Figure 3F:
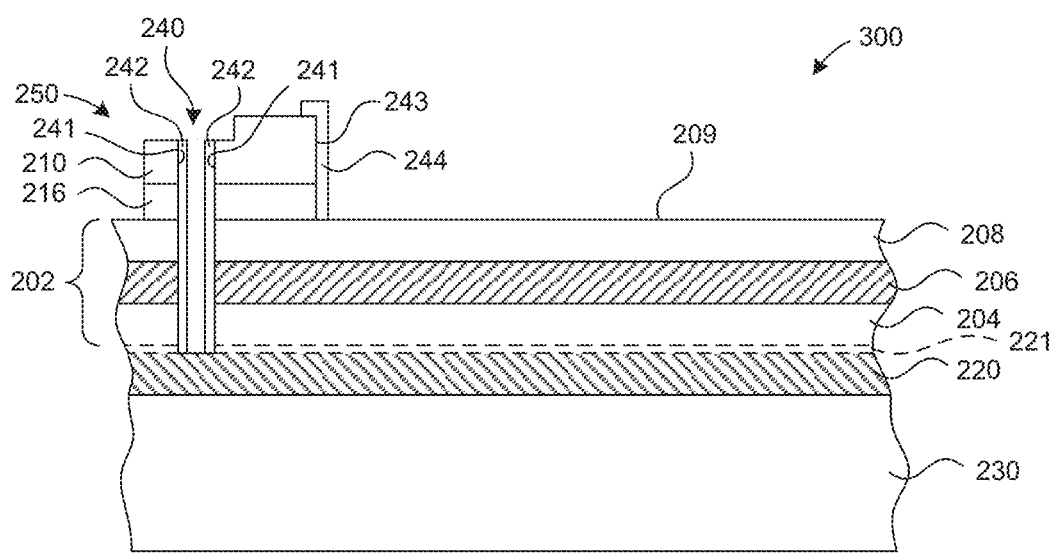

FIG. 3E illustrates the microelectronic substrate 300 after a via 240 has been formed through the electrostatic discharge device 250 and a portion the SSE 202. The via 240 can be formed by drilling, etching, or other techniques known in the semiconductor fabrication arts. The via 240 includes sidewalls 241 and provides access to the reflective material 220 which is in electrical communication with the first semiconductor material 204. In other embodiments, the via 240 provides access to the conductive material 221, which is in direct electrical contact with the first semiconductor material 204. FIG. 3F shows the microelectronic substrate 300 after a first insulator 242 has been deposited or formed in the via 240 and a second insulator 244 has been deposited or formed on a lateral sidewall 243 of the electrostatic discharge device 250.

Figure 3G:
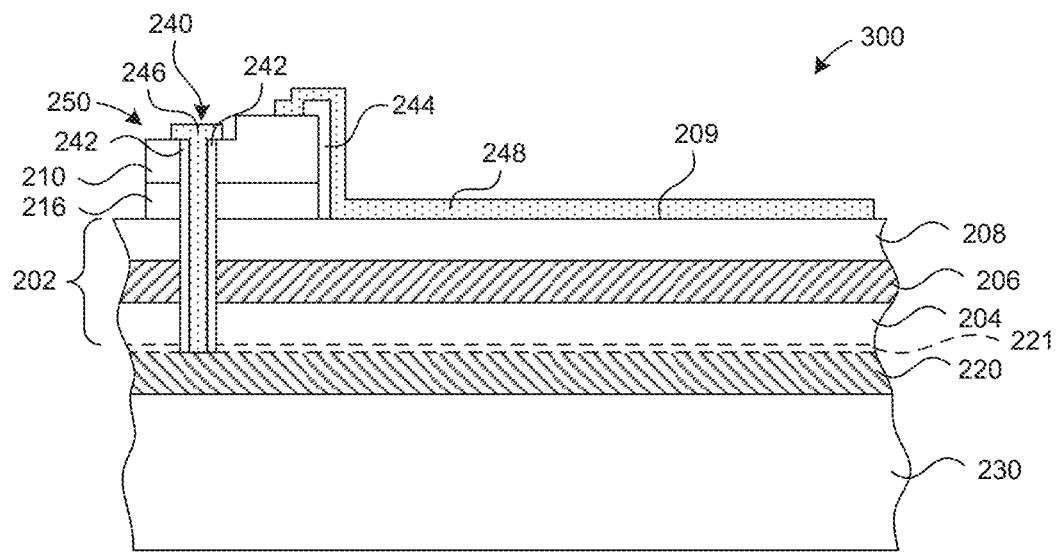

FIG. 3G shows the microelectronic substrate 300 after a conductive material has been disposed in the via 240 (inward of the first insulator 242), and outside the via 240 to form the first contact 246. The first contact 246 can comprise silver (Ag), gold (Au), gold-tin (AuSn), silver-tin (AgSn), copper (Cu), aluminum (Al), and/or other conductive materials. The first contact 246 is insulated from the semiconductor material 216 and the SSE 202 by the first insulator 242. The second contact 248 has been deposited or otherwise disposed or formed on the outer surface 209 of the SSE 202 and on the epitaxial growth substrate 210 of the electrostatic discharge device 250. The second insulator 244 insulates the second contact 248 from the semiconductor material 216.

In selected embodiments, a lens (not shown in FIG. 3G) can be formed over the SSE 202. The lens can include a light-transmissive material made from silicone, polymethylmethacrylate (PMMA), resin, or other materials with suitable properties for transmitting the radiation emitted by the SSE 202. The lens can be positioned over the SSE 202 such that light emitted by the SSE 202 and reflected by the reflective material 220 passes through the lens. The lens can include various optical features, such as a curved shape, to diffract or otherwise change the direction of light emitted by the SSE 202 as it exits the lens.

Embodiments of the integral electrostatic discharge device 250 offer several advantages over traditional systems. For example, because in particular embodiments the electrostatic discharge device 250 is comprised of materials (e.g., the epitaxial growth substrate 210 and the semiconductor material 216) that are also used to form the SSE 202, the material cost can be less than that of separately-formed electrostatic devices. Moreover, traditional systems having a separate electrostatic discharge die require additional pick-and-place steps to place the die proximate to the SSE 202. Still further, such traditional systems require forming additional and/or separate electrical connections to connect the electrostatic device to the SSE.

Figure 4:
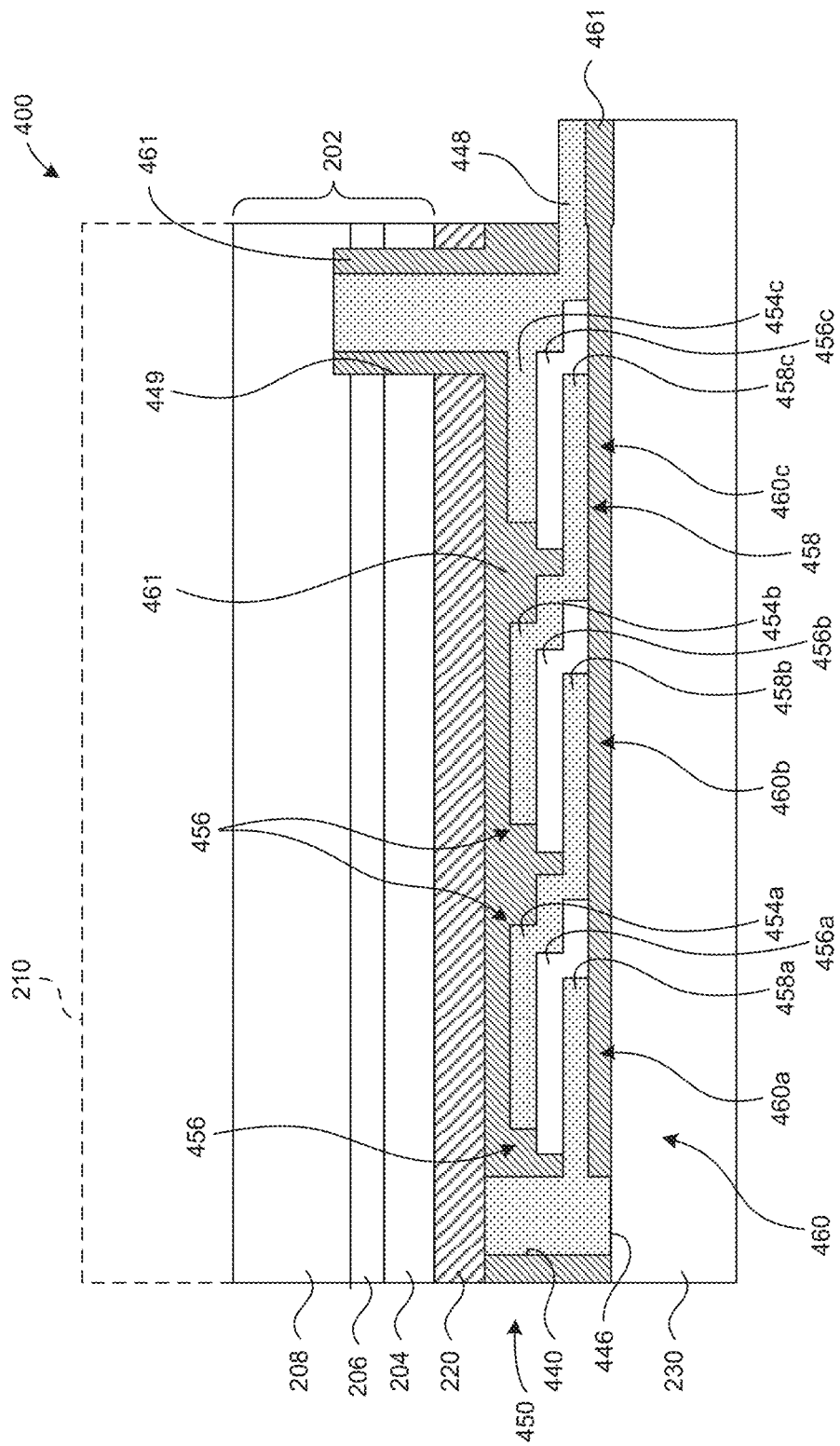
FIG. 4 is a cross-sectional view of an SST device having an electrostatic discharge device configured and integrated in accordance with embodiments of the presently disclosed technology.

FIG. 4 is a cross-sectional view of an SST device 400 having an electrostatic discharge device 450 configured in accordance with further embodiments of the present technology. The SST device 400 can have several features generally similar to those described above with reference to FIGS. 2-3G. For example, the SST device 400 can include an SSE 202 that in turn includes a first semiconductor material 204 (e.g., a P-type material), a second semiconductor material 208 (e.g., an N-type material), and an active region 206 between the first and second semiconductor materials 204, 208. The SST device 400 can further include a reflective material 220 between the support substrate 230 and the SSE 202. Typically, the SSE 202 and the reflective/conductive material 220 are formed on an epitaxial growth substrate 210 (shown in dashed lines in FIG. 4). The structures that form the electrostatic discharge device 450 and that electrically connect the electrostatic discharge device 450 to the SSE can be formed on the SSE 202 while the SSE 202 is supported by the epitaxial growth substrate 210. The epitaxial growth substrate 210 can then be removed.

In the illustrated embodiment, the electrostatic discharge device 450 is fabricated on the SSE 202, and both the SSE 202 and the electrostatic discharge device 450 are carried by the substrate 230, with the electrostatic discharge device 450 positioned between the substrate 230 and the SSE 202. Typically, the fabrication steps for forming the electrostatic discharge device 450 are performed while the SSE 202 is inverted from the orientation shown in FIG. 4, and before the substrate 230 is attached. The electrostatic discharge device 450 can include a plurality of electrostatic junctions 460 (identified individually as first-third junctions 460a-460c). Each electrostatic junction 460 can include a first conductive material 454 (identified individually by reference numbers 454a-454c), an intermediate material 456 (identified individually by reference numbers 456a-456c), and a second conductive material 458 (identified individually by reference numbers 458a-458c). The materials can be disposed using any of a variety of suitable deposition, masking, and/or etching processes. These materials can be different than the materials forming the SSE 202 because they are not required to perform a light emitting function. As noted above and as will be understood by one of ordinary skill in the art, these techniques can be used to sequentially form the illustrated layers on the SSE 202 while the SST 400 is inverted relative to the orientation shown in FIG. 4. One or more insulating materials 461 electrically isolates the layers from the first semiconductor material 204 and/or from the support substrate 230.

The intermediate material 456 can have electrical properties different than those of the first conductive material 454 and the second conductive material 458. In some embodiments, the intermediate material 456 can be a semiconductor (e.g., amorphous silicon) or a metal. The first conductive material 454a of one junction (e.g., the first junction 460a) is electrically coupled to the second conductive material 458b of an adjacent junction (e.g., the second junction 460b). While the illustrated electrostatic discharge device 450 includes three junctions 460 placed in series, in further embodiments more or fewer junctions 460 can be used. Furthermore, to obtain different current-handling capacities for the electrostatic discharge device 450, the junctions 460 can be altered in size, and/or multiple junctions 460 can be arranged in parallel.

The electrostatic discharge device 450 can further include a first contact 448 positioned at a first via 449 and electrically connected between one of the junctions 460 (e.g., to the first metal layer 454c of the third junction 460c), and to the second semiconductor material 208. The electrostatic discharge device 450 additionally includes a second contact 446 positioned at a second via 440 extending through the electrostatic discharge device 450. The second contact 446 electrically couples a junction 460 (e.g., the second metal layer 458a of the first junction 460a) to the reflective material 220 or, in further embodiments, to a separate conductive layer or to the first semiconductor material 204. The substrate 230 can be conductive so as to route current to the second contact 446. An insulating material 461 electrically isolates the first and second contacts 446, 448 from adjacent structures.

In some embodiments, components of the electrostatic discharge device 450 are deposited on the SSE 202 by PVD, ALD, plating, or other techniques known in the semiconductor fabrication arts. The first and second vias 449 and 440 can be formed in the electrostatic discharge device 450 and/or the SSE 202 using the methods described above with reference to FIG. 3E. In a representative embodiment, the electrostatic discharge device 450 is formed on the SSE 202 before the substrate 230 is attached. In some embodiments, the electrostatic discharge device 450 can be attached to the substrate and/or the SSE 202 by means of bonding layers. In still further embodiments, the electrostatic discharge device 450 can be positioned on a portion of an external surface of the SSE 202 without the substrate 230.

Figure 5A:
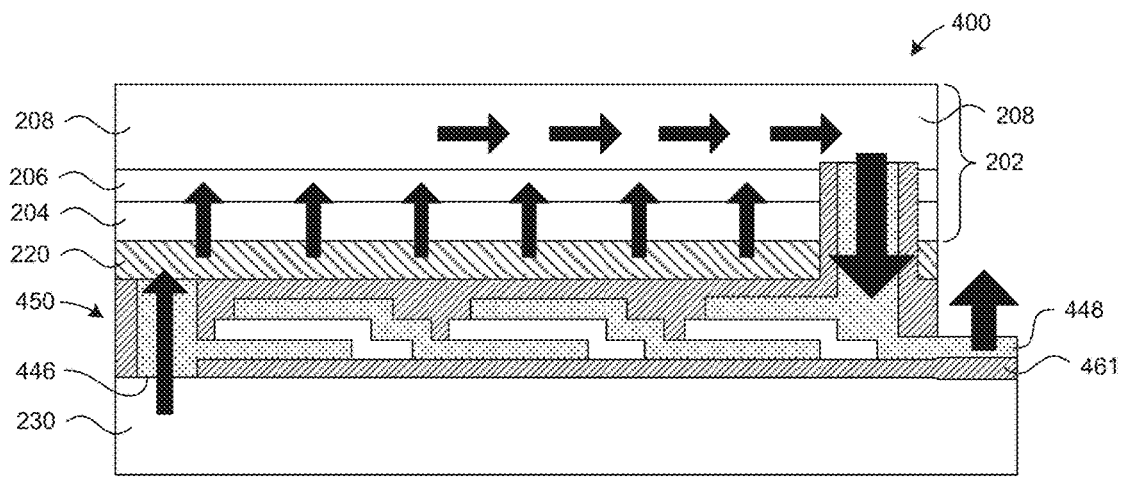
FIGS. 5A and 5B are cross-sectional views of the SST device of FIG. 4 during operation in accordance with embodiments of the presently disclosed technology.
Figure 5B:
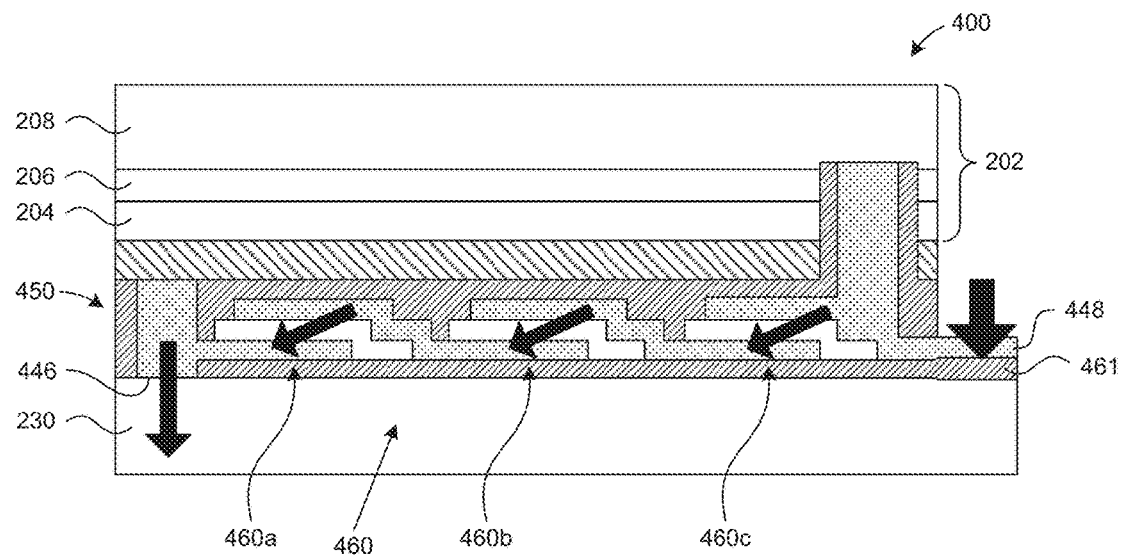

FIGS. 5A and 5B are cross-sectional views of the SST device 400 of FIG. 4 during operation in accordance with embodiments of the technology. During normal operation, as illustrated in FIG. 5A, current flows in the direction of the arrows from the second contact 446 to the first semiconductor material 204, through the SSE 202 to the second semiconductor material 208 as described above, to the first contact 448. As illustrated in FIG. 5B, during an electrostatic discharge event, the SST device 400 can be protected from reverse currents by providing a path for reverse current flow, illustrated by the arrows, through the junctions 460. The reverse current can be directed through the substrate 230, rather than through the SSE 202.

Figure 6:
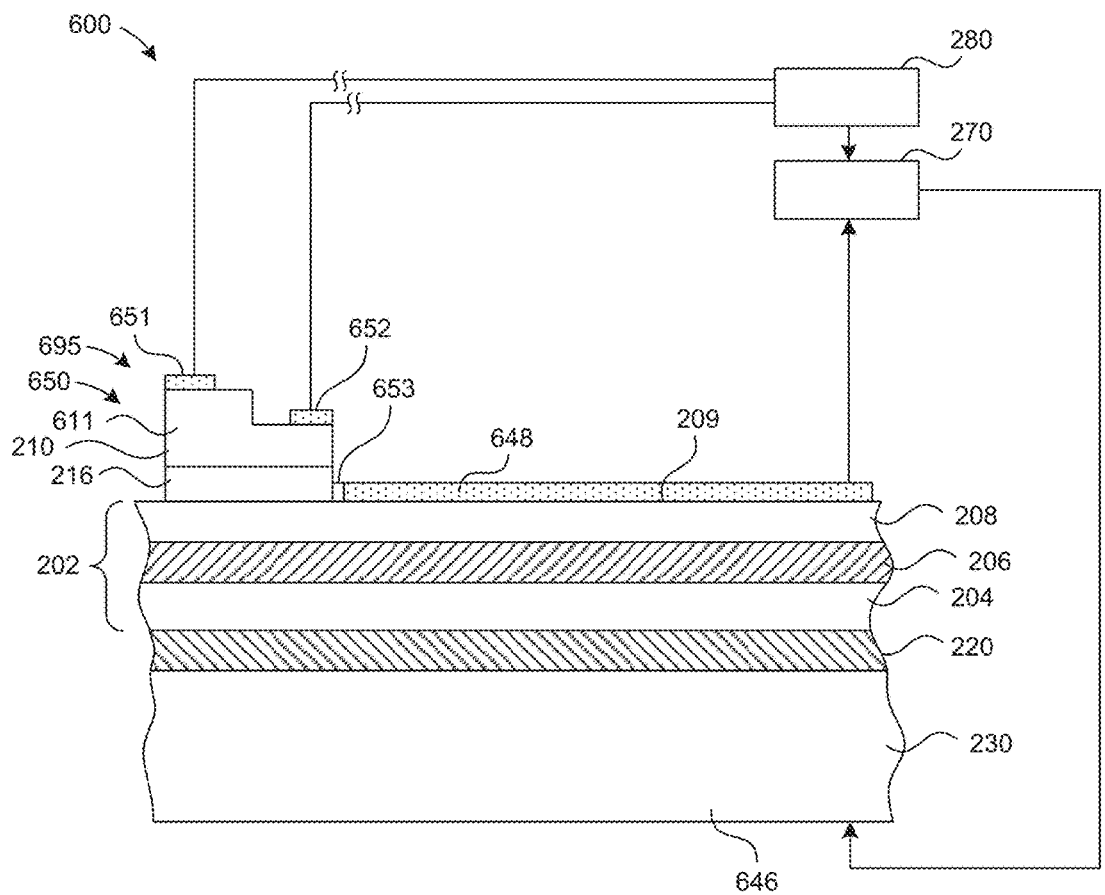
FIG. 6 is a partially schematic illustration of an SST device having an integrated photodiode formed from an epitaxial growth substrate in accordance with an embodiment of the presently disclosed technology.

FIG. 6 is a partially schematic, partial cross-sectional illustration of a system 600 that includes a solid state emitter 202 having components generally similar to those described above, including an active region 206 positioned between a first semiconductor material 204 and a second semiconductor material 208. The SSE 202 is carried by a support substrate 230, and a conductive/reflective material reflects emitted radiation outwardly through the second semiconductor material 208. The support substrate 230 can be conductive and can accordingly function as a first contact 646. The SSE 202 receives power from the first contact 646 and a second contact 648.

The system 600 can further include a state device 695 that in turn includes a photosensor 650 (e.g., a photodiode). The photosensor 650 can be formed using residual material from the buffer layer 216 and the epitaxial growth substrate 210, in a manner generally similar to that described above with reference to FIGS. 2B-3D. In a particular aspect of an embodiment shown in FIG. 6, the epitaxial growth substrate 210 is doped and/or otherwise treated to form a photosensitive state-sensing component 611. Representative materials for forming the state-sensing component 611 include silicon germanium, gallium arsenide and lead sulfide. The state-sensing component 611 can be coupled to a first state device contact 651 and a second state device contact 652, which are in turn connected to the controller 280. An insulating material 653 provides electrical insulation between the photosensor 650 and the second contact 648. In a further particular aspect of this embodiment, the buffer layer 216 is transparent, allowing light emitted from the active region 206 to impinge upon the state-sensing component 611. This in turn can activate the state-sensing component 611, which in turn transmits a signal to the controller 280. Based upon the signal received from the state device 695, the controller can direct the power source 270 to supply, halt, and/or change the power provided to the SSE 202. For example, if the state device 695 identifies a low output level for the SSE 202, the controller 280 can increase the power provided to the SSE 202. If the SSE 202 produces more than enough light, the controller 280 can reduce the power supplied to the SSE 202. If the color, warmth, and/or other characteristic of the light detected by the state device 695 falls outside a target range, the controller 280 can control the power provided to the SSE 202 and/or can vary the power provided to multiple SSEs 202 that together produce a particular light output.

Figure 7:
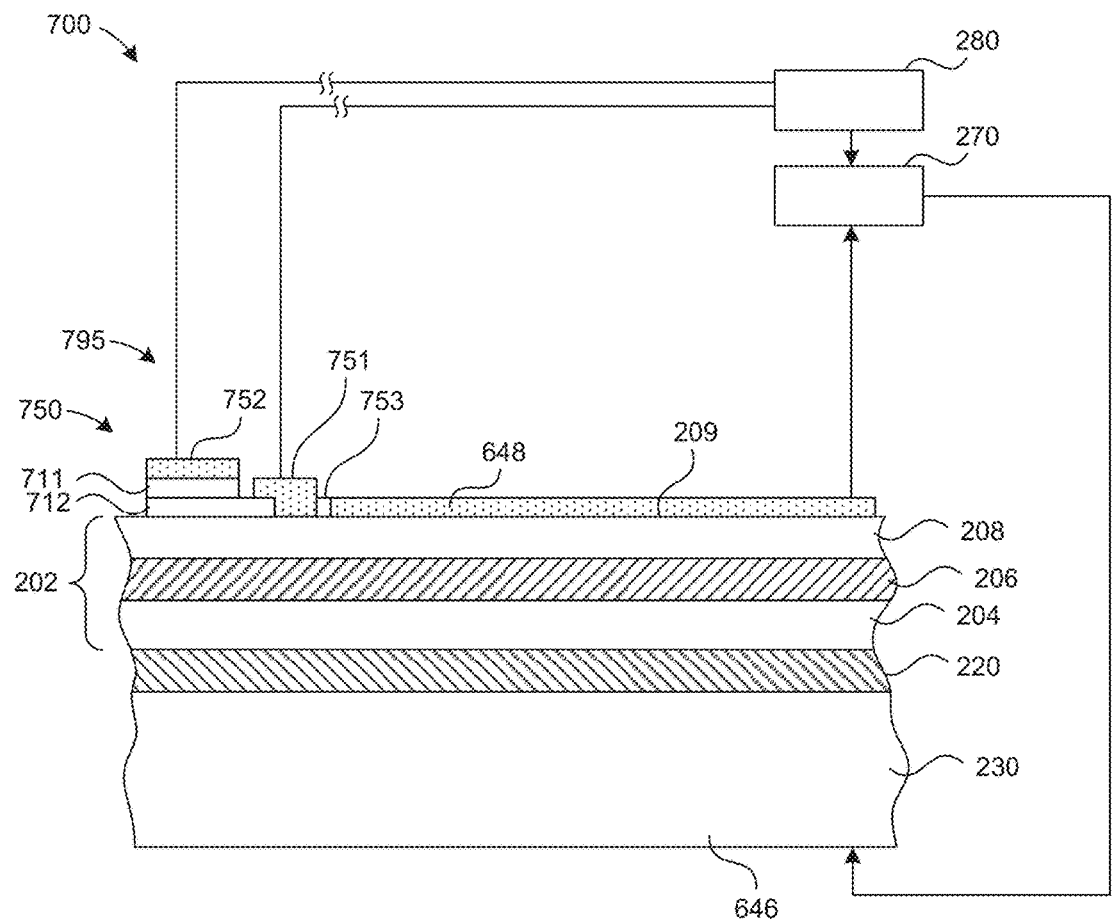
FIG. 7 is a partially schematic, cross-sectional illustration of an SST device having an integrated photodiode formed on an additional substrate material in accordance with another embodiment of the presently disclosed technology.

FIG. 7 is a partially schematic, partial cross-sectional illustration of a device 700 that includes a state device 795 in the form of a photosensor 750 in accordance with another embodiment. Unlike the arrangement described above with reference to FIG. 6, the photosensor 750 shown in FIG. 7 is not formed from residual material used to form the SSE 202. Instead, the photosensor 750 can include a state-sensing component 711 and an electrically conductive, transparent material 712 (e.g., zinc oxide) disposed between the state-sensing component 711 and the second semiconductor material 208. The state-sensing component 711 can include amorphous silicon and/or another material that is responsive to light emanating from the active region 206 and passing through the conductive/transparent material 712. The state device 795 can further include first and second state device contacts 751, 752 that transmit signals to the controller 280 corresponding to the amount, quality and/or other characteristic of the light received from the active region 206. An insulating material 753 provides electrical insulation between the state device 795 and the second contact 648. Accordingly, the system 700 (and in particular, the controller 280) can direct the operation of the SSE 202 based upon information received from the state device 795.

In both of the embodiments described above with reference to FIGS. 6 and 7, the state device and state-sensing component are positioned so as to receive at least some of the light that would normally be transmitted directly out of the solid state transducer. In particular, the state-sensing devices can be positioned along a line of sight or optical axis between the active region 206 and the external environment that receives light from the active region 206. In other embodiments, the state-sensing device can be buried within or beneath the SSE 202 of the optical axis in a manner that can reduce or eliminate the potential interference of the state-sensing devices with light or other radiation emitted by the SSE 202. FIGS. 8A-8L describe a process for forming such devices in accordance with particular embodiments of the disclosed technology.

Figure 8A:
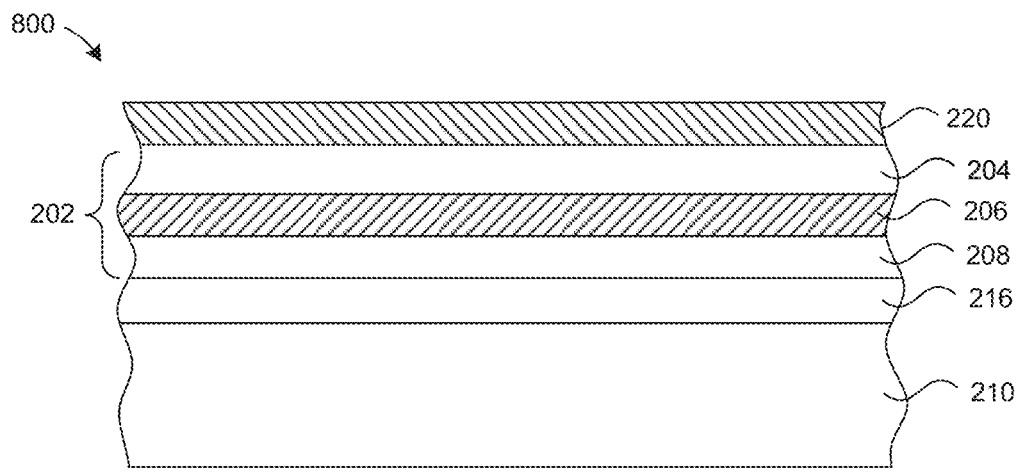
FIGS. 8A-8L are partially schematic, cross-sectional illustrations of a process for forming an SST device having an integrated photodiode located beneath an active material in accordance with another embodiment of the presently disclosed technology.
Figure 8B:
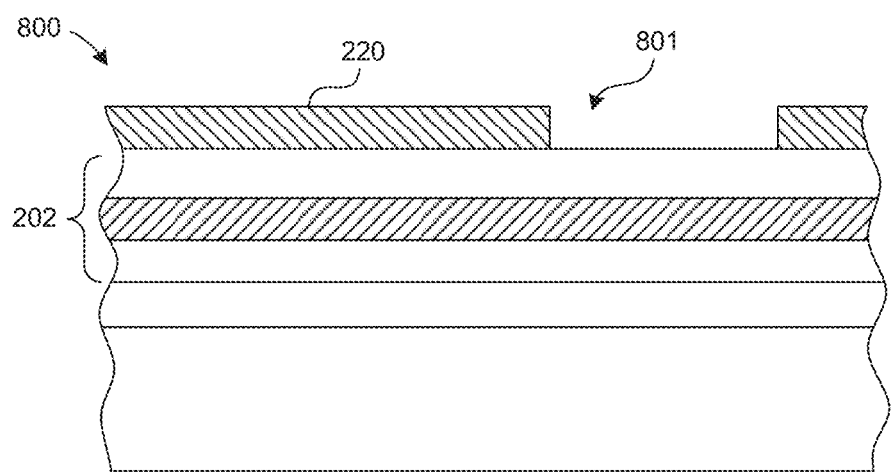

FIG. 8A illustrates a device 800 during a particular phase of manufacture at which the device 800 includes components generally similar to those described above with reference to FIG. 3A. Accordingly, the system can include an epitaxial growth substrate 210 upon which a buffer layer 216 and an SSE 202 are fabricated. The SSE 202 can include an active region 206 positioned between first and second semiconductor materials 204, 208. A conductive, reflective material 220 is positioned to reflect incident light away from these first semiconductor material 204 and through the active region 206 and the second semiconductor material 208.

Figure 8C:
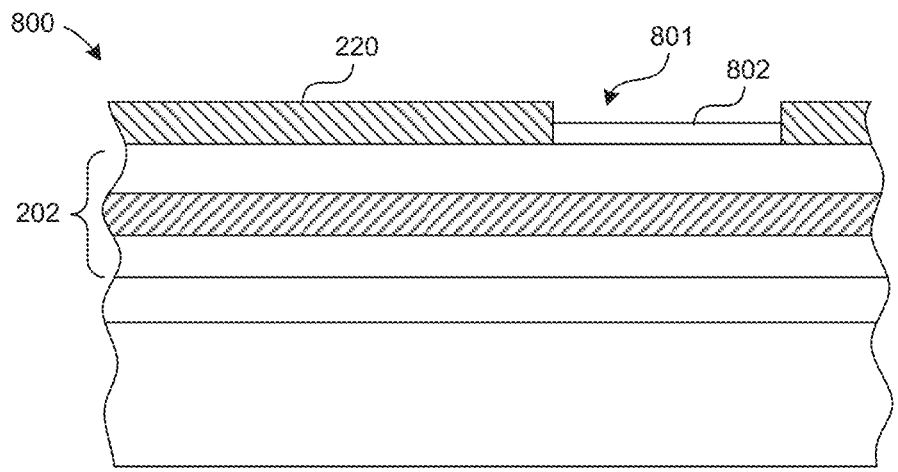
Figure 8D:
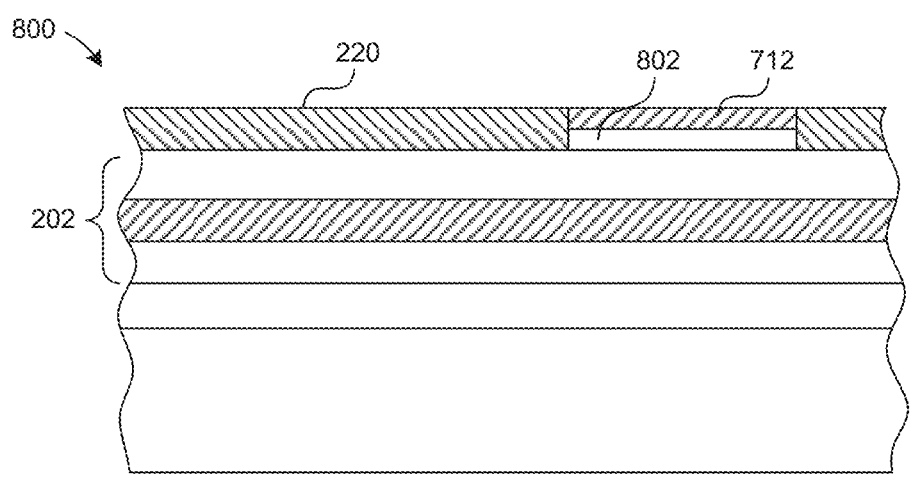
Figure 8E:
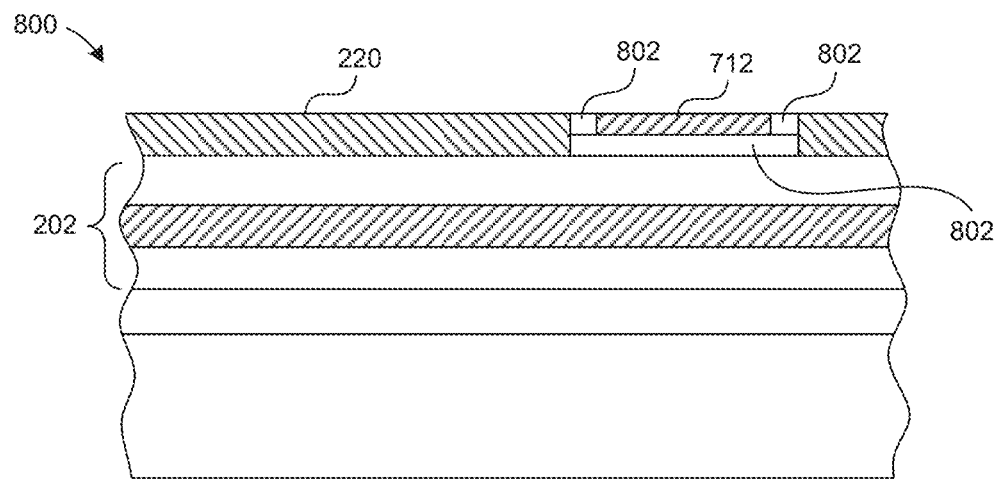

The processes described below with reference to FIGS. 8B-8L include disposing and removing material using any of a variety of suitable techniques, including PVD or CVD (for deposition) and masking/etching for removal. Using these techniques, sequential layers of material are stacked along a common axis to produce the final product. Beginning with FIG. 8B, a recess 801 is formed in the conductive, reflective material 220. The recess 801 allows light to pass from the SSE 202 to a photosensitive state device formed in and/or in optical communication with the recess 801. In FIG. 8C, a transparent insulating material 802 is disposed in the recess 801. In FIG. 8D, a transparent conductive material 712 is disposed on the transparent insulating material 802 within the recess 801. As shown in FIG. 8E, a portion of the transparent conductive material 712 is removed, and the space formerly occupied by the removed portion is filled with additional transparent insulating material 802. Accordingly, the transparent conductive material 712 is electrically isolated from the surrounding conductive reflective material 220 by the transparent insulating material 802.

Figure 8F:
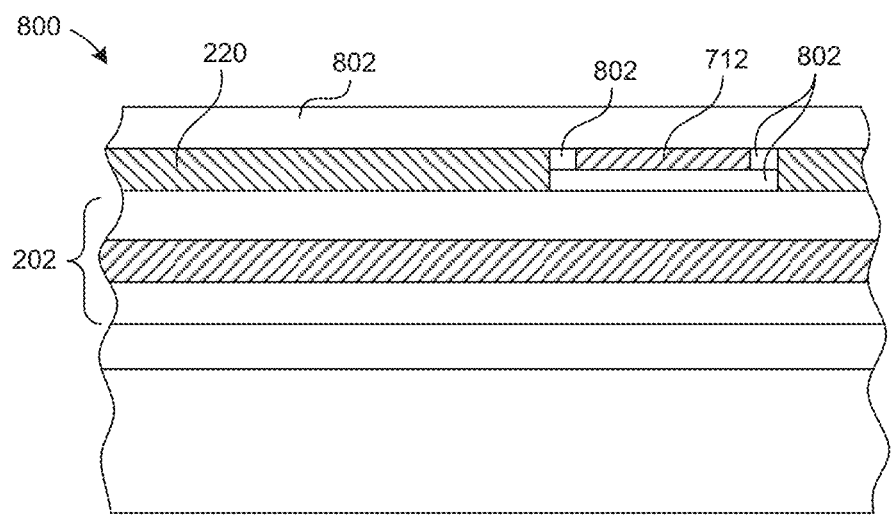
Figure 8G:
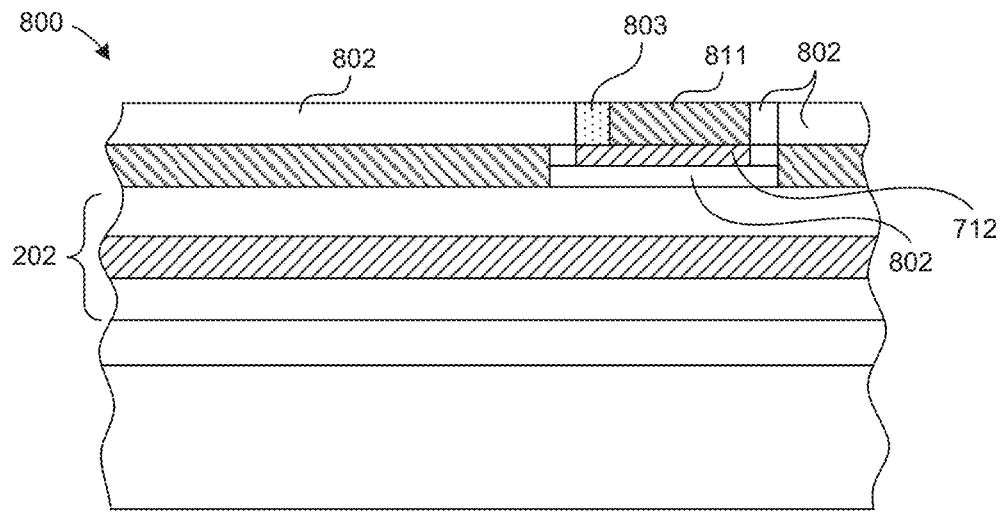

In FIG. 8F, an additional layer of transparent insulating material 802 is disposed over the transparent conductive material 712. In FIG. 8G, a portion of the transparent insulating material 802 positioned over the transparent conductive material 712 is removed and replaced with a state-sensing component 811. In a representative embodiment, the state-sensing component 811 include amorphous silicon, and in other embodiments, the state-sensing component 811 can include other materials. In any of these embodiments, an additional volume of transparent insulating material 802 is disposed on one side of the state-sensing component 811, and a first contact material 803 is disposed on the other side so as to contact the transparent conductive material 712.

Figure 8H:
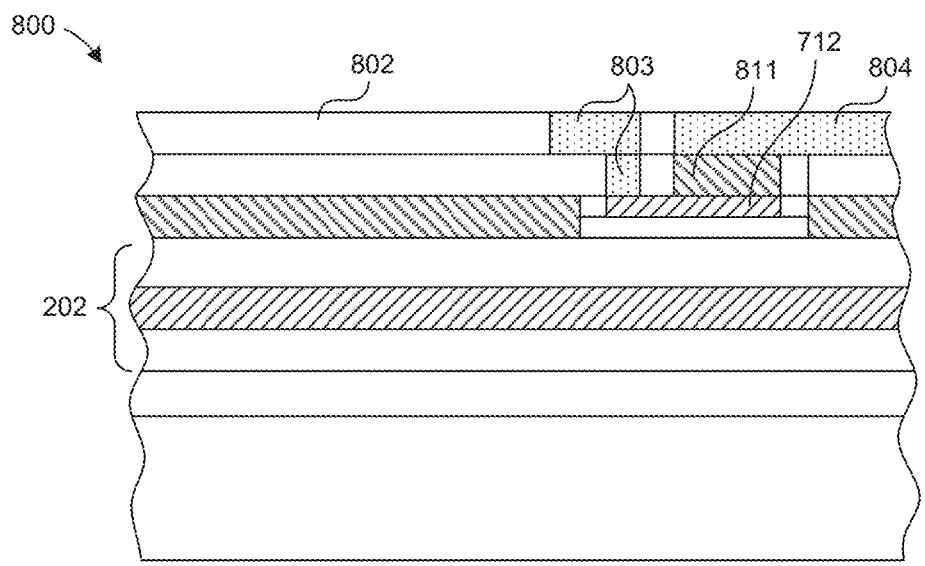

In FIG. 8H, yet a further layer of transparent insulating material 802 is disposed on the underlying structures. A portion of this layer is removed and filled with additional first contact material 803 to form an electrical contact with one side of the state-sensing component 811 via the transparent conductive material 712. A second contact material 804 is disposed in contact with the opposite surface of the state-sensing component 811 to provide for a complete circuit.

Figure 8I:
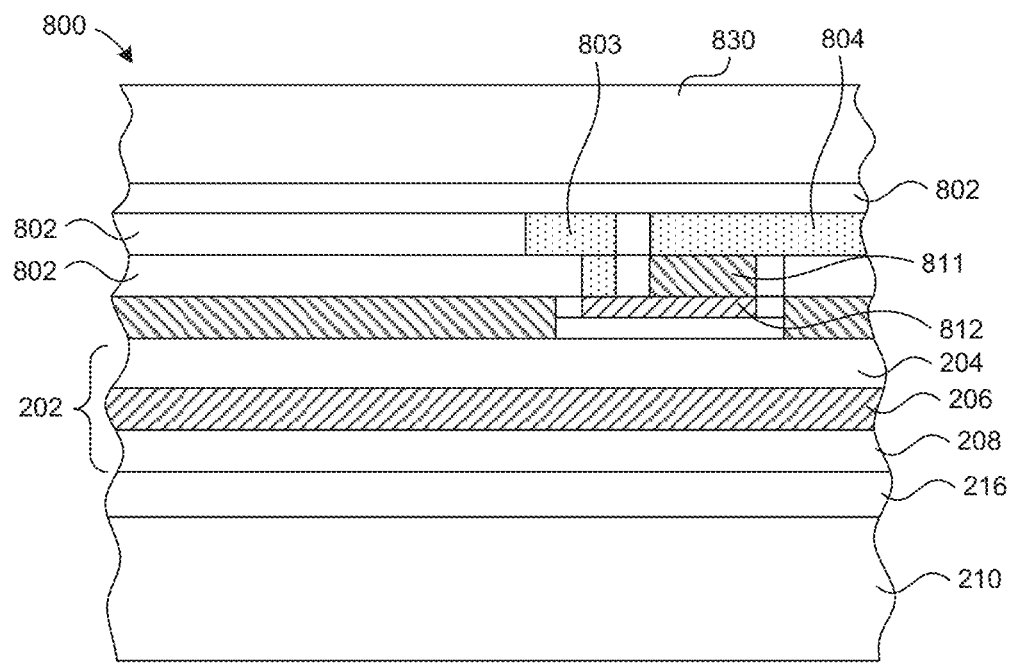
Figure 8J:
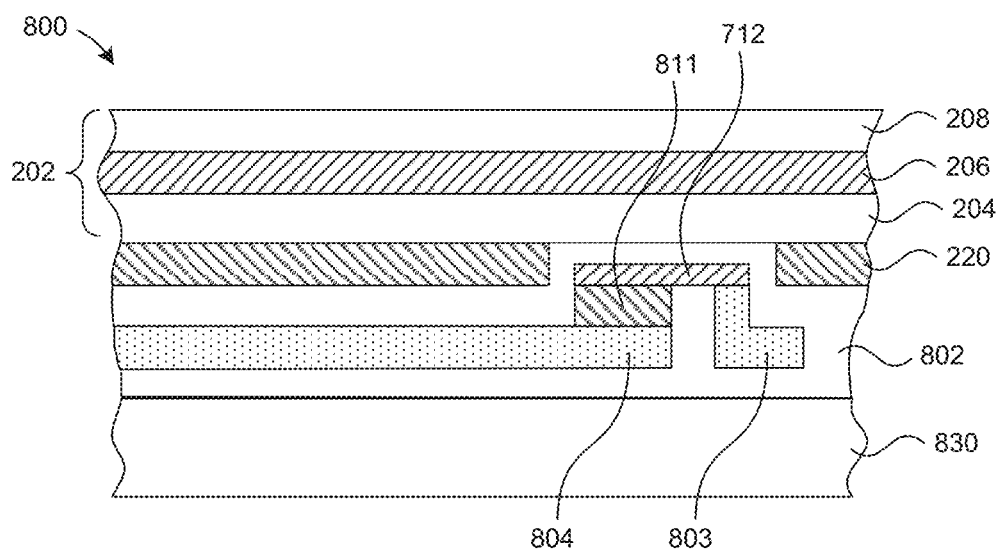
Figure 8K:
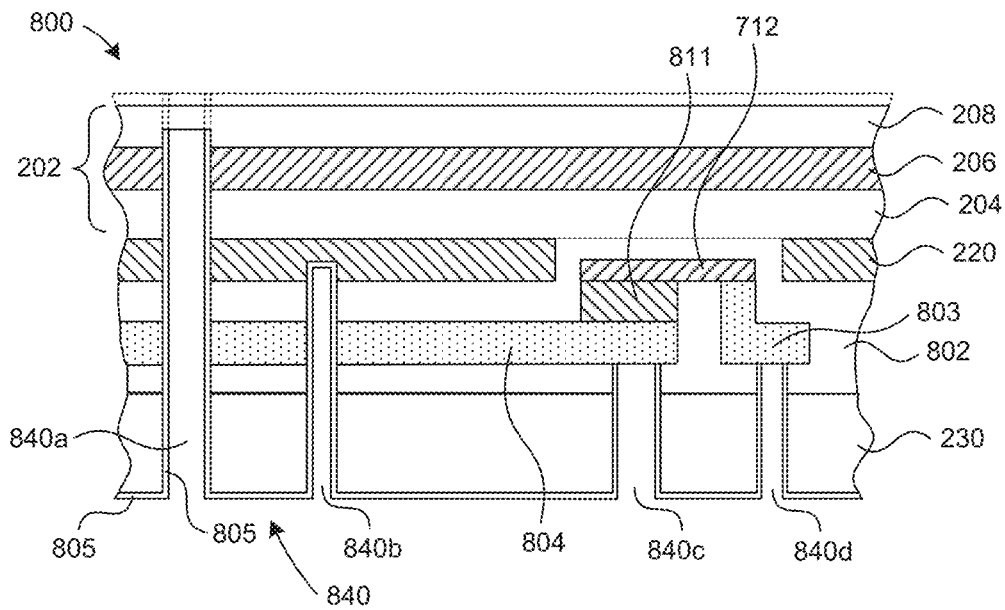

In FIG. 8I, a further layer of transparent insulating material 802 is disposed over the first and second contact materials 803, 804, and a substrate support 830 is attached to the insulating material 802. The structure is then inverted, as shown in FIG. 8J and the epitaxial growth substrate 210 and buffer material 216 shown in FIG. 8I are removed. Accordingly, the second semiconductor 208 material is now exposed. In FIG. 8K, a plurality of vias 840 (four are shown in FIG. 8K as vias 840a-840d) are made through the substrate support 230 to an extent sufficient to make electrical contact with multiple components within the device 800. For example, a first via 840a makes contact with the second semiconductor material 208 (or, as indicated in dashed lines, a transparent conductive layer overlying the second semiconductor material 208), a second via 840b makes contact with the conductive, reflective material 220, a third via 840c makes contact with the second contact material 804, and a fourth via makes contact with the first contact material 803. Each of the vias 840a-840d is lined with an insulating material 805 to prevent unwanted electrical contact with other elements in the stack.

Figure 8L:
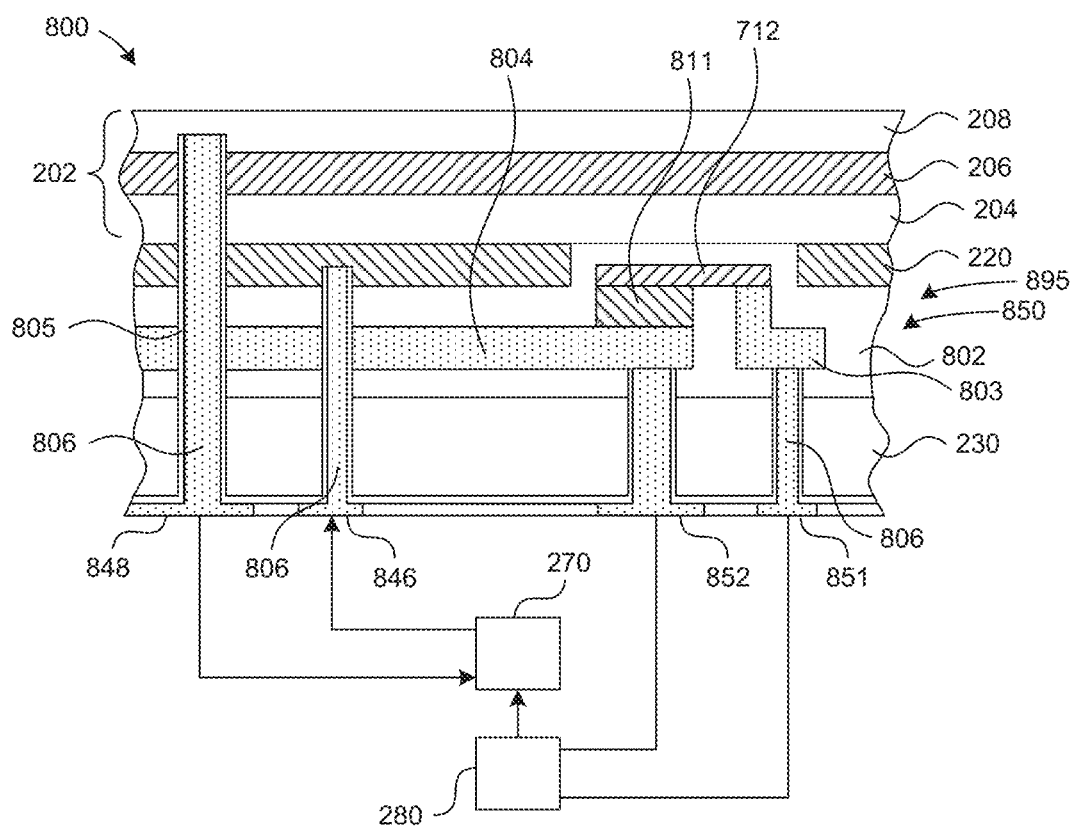

FIG. 8L is a partially schematic illustration of the device 800 after each of the vias 840 has been filled with a conductive material 806. The conductive material 806 forms first and second contacts 846, 848, which provide power from the power source 270 to the SSE 202. The conductive material 806 also forms first and second state device contacts 851, 852 that provide electrical communication with the controller 280. As in the case of the embodiments described above with reference to FIGS. 6 and 7, the resulting state device 895 is stacked along a common axis with the SSE 202. Unlike the arrangement described above with reference to FIGS. 6 and 7, the state device 895 (in the form of a photosensor 850) is not in the direct optical path of light or other radiation emitted by the SSE 202. In operation, the state-sensing component 811 receives radiation through the transparent, insulating material 802 and the transparent conductive material 712. Based upon the radiation incident on the state-sensing component 811, the photosensor 850 can send a signal to the controller 280 which in turn controls the power source 270 and the SSE 202.

Further details of particular embodiments for constructing an SST device generally similar to that described above with reference to FIGS. 8A-8L are included in co-pending U.S. application Ser. No. 13/218,289, titled "Vertical Solid State Transducers Having Backside Terminals and Associated Systems and Methods", filed on Aug. 25, 2011, and incorporated herein by reference. In other embodiments, the SST devices can be coupled to external devices with contacts having positions, arrangements, and/or manufacturing methodologies different than those expressly described above.

Figure 9:
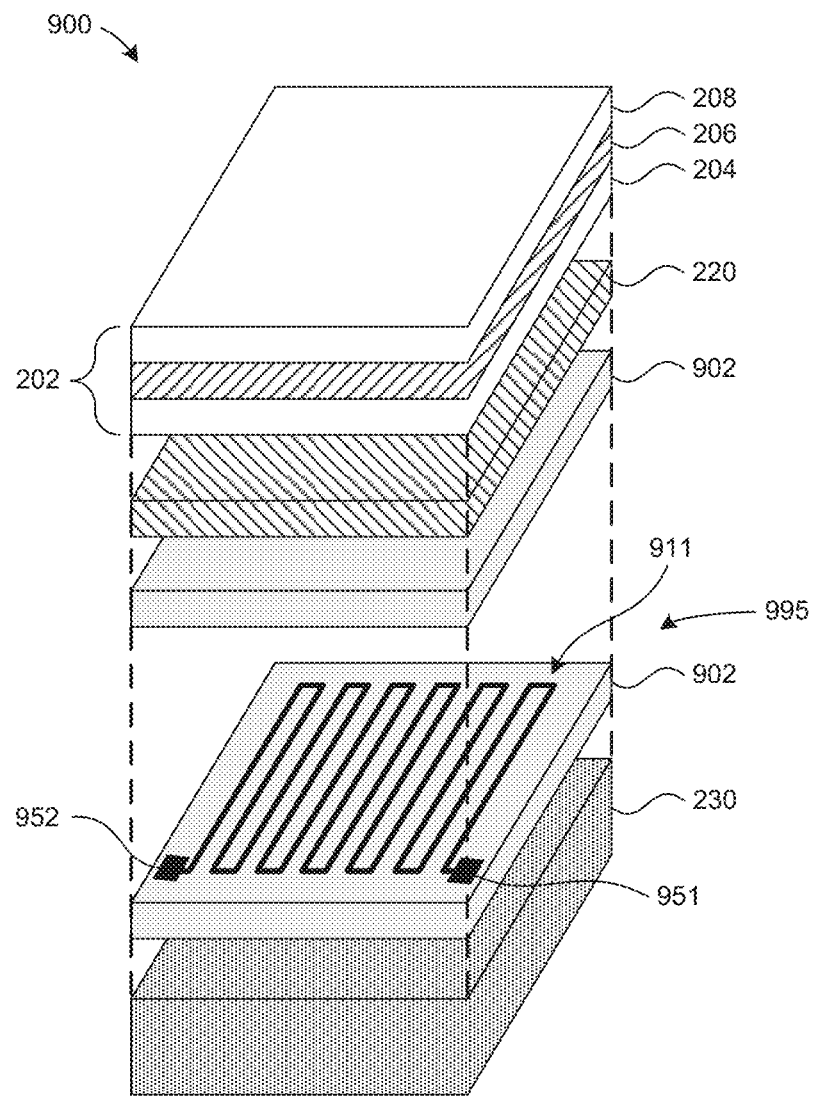
FIG. 9 is a partially schematic, isometric illustration of an SST device having an integrated thermal sensor in accordance with still another embodiment of the presently disclosed disclosure.

FIG. 9 is a partially schematic, partially exploded illustration of an SST device 900 that include a state device 995 configured to detect thermal characteristics associated with the SSE 202. In the illustrated embodiment, the state device 995 can include an insulating layer 902 positioned between the conductive reflective contact 220 and a state-sensing component 911. In a further particular embodiment, the state-sensing component 911 can include a thermistor material (e.g., a suitable polymer or ceramic) and in other embodiments, the state-sensing component 911 can include other thermally sensitive materials (e.g., resistive metals). In any of these embodiments, an additional volume of insulting material 902 can be positioned against the state-sensing component 911 to "sandwich" the state-sensing component 911 and electrically insulate the state-sensing component 911 from the SSE 202. First and second state device contacts 951, 952 provide electrical communication with the state-sensing component 911. In particular embodiments, the state-sensing component 911 can include a material strip with a serpentine shape that increases component sensitivity (e.g., increases impedance or resistance change as a function of temperature). In other embodiments, the state-sensing component 911 can have other shapes. The state device contacts 951, 952 and the SSE contacts can have any of a variety of locations, including those shown in FIG. 9. For example, all the contacts can be located at the top of the device, or the state device contacts can be at the top of the device and one or more SSE contacts at the bottom of the device, or all the contacts can be buried (e.g., as shown in FIG. 8L). These options apply to the ESD state-sensing components and optical state-sensing components described above with reference to FIGS. 2B-8L as well.

In operation, the state-sensing component 911 can be coupled to a controller generally similar to that described above with reference to FIG. 7, and can control the operation of the SSE in a manner based upon thermal inputs. In particular, the state-sensing component 911 can sense the temperature of the SSE 202 and/or other components of the SST device 900. In response to a high temperature indication, the controller can reduce the power provided to the SST device 900 to allow the SST device 900 to cool before it becomes damaged. After the SST device 900 has cooled (an event also indicated by the state-sensing component 911), the controller can increase the power provided to the SST device 900. An advantage of the arrangement described above with reference to FIG. 9 is that the state-sensing component 911 can provide feedback that reduces high temperature operation of the SSE 202. In particular, the feedback can be used to account for reduced SSE output, reduced safe drive current, reduced forward voltage and/or reduced SSE lifetime, all of which are associated with high temperature operation.

One feature of several of the embodiments described above is that the state-sensing component can be formed so as to be integral with the SST and/or the SSE. Embodiments of the integrally formed state devices are not pre-formed structures and accordingly are not attachable to the SST as a unit, or removable from the SST as a unit without damaging or rendering inoperable the SSE. The SSE and the state device can accordingly be formed as a single chip or die, rather than being formed as two separate dies that may be electrically connected together in a single package. For example, the SSE and the state device can both be supported by the same, single support substrate (e.g., the support substrate 230). For example, they can be formed from a portion of the same substrate on which the solid state emitter components are formed, as described above with reference to FIGS. 2-3G and 6. In the embodiments described with reference to FIGS. 4, 5, 7 and 8A-8L, the same epitaxial growth substrate is not used for both the solid state emitter and the state device, but the components that form the state device can be formed in situ on the solid state emitter. An advantage of the latter approach is that, in at least some embodiments, the state device can be formed so as to be on the side of the solid state emitter opposite from the path of light emitted by the solid state emitter. Accordingly, the presence of the state device does not interfere with the ability of the solid state emitter to emit light or other radiation.

Although the state device can be formed integrally with the SSE or SST, it performs a function different than that of the SSE and, accordingly, includes materials different than those that form the SSE (e.g., different than the first semiconductor material, the second semiconductor material, and the active region in between). This is the case whether the same epitaxial growth substrate used for the solid state emitter is used for the state device, or whether the state device does not use the same epitaxial growth substrate. As a result, the materials and structural arrangement of the state device are not limited to the materials and structural arrangement of the SSE. This enhanced degree of flexibility can allow for smaller state devices and greater state device efficiencies. For example, state devices in the form of photodiodes can include materials that are specifically selected to be thin and/or highly absorptive at the wavelength emitted by the SSE, producing a compact, efficient structure.

From the foregoing, it will be appreciated that specific embodiments of the technology have been described herein for purposes of illustration, but that various modifications may be made without deviating from the disclosure. For example, some of the embodiments described above discuss the state devices as a diode (e.g., an ESD protection diode or a photodiode). In other embodiments, the state device can include a different, non-linear circuit element. In still further embodiments, the state device may be linear (e.g., the thermal sensor can be a linear thermal sensor). The electrostatic discharge device can be constructed and connected to protect the SSE from large reverse voltages, as discussed above in particular embodiments. In other embodiments, the electrostatic discharge device can be connected with a forward bias to prevent the SSE from large forward voltages. In still further embodiments, the SSE can be connected to both types of ESDs, to protect against both high forward and high reverse voltages. Additionally, in certain embodiments, there may be more than one state devices for a particular SST device. Furthermore, material choices for the SSE and substrates can vary in different embodiments of the disclosure.

Certain elements of one embodiment may be combined with other embodiments, in addition to or in lieu of the elements of the other embodiments, or may be eliminated.

For example, in some embodiments, the disclosed buffer material can be eliminated. In some embodiments, the buffer material can be used to form the SSE, but not the state device. The disclosed state devices can be combined in other embodiments. For example, a single SST device can include any of a variety of combinations of ESD devices, photosensors and/or thermal sensors. Accordingly, the disclosure can encompass other embodiments not expressly shown or described herein.

We claim:

1. A solid state transducer system, comprising:
a support substrate having a first side and a second side;
a solid state emitter carried by the support substrate over the first side of the support substrate, the solid state emitter comprising a first semiconductor component, a second semiconductor component, and an active region between the first and second semiconductor components;
a state device carried by the support substrate over the first side of the support substrate and positioned to detect a state of the solid state emitter, wherein—
the state device is formed from at least one state-sensing component having a composition different than that of the first semiconductor component, the second semiconductor component, and the active region,
the state device and the solid state emitter are stacked along a common axis,
the state device includes a photosensor positioned to receive radiation emitted by the solid state emitter, and
the signal corresponds to a characteristic of the radiation;
a first via extending through the substrate to the first semiconductor component of the solid state emitter, the first via having an electrically conductive material that defines a first emitter contact at the second side of the substrate;
a second via extending through the substrate to the second semiconductor component of the solid state emitter, the second via having an electrically conductive material that defines a second emitter contact at the second side of the substrate; and
a controller operatively coupled to the solid state emitter and the state device to receive a signal from the state device and control the solid state emitter based at least in part on the signal received from the state device.

2. The system of claim 1, further comprising a power source, and wherein:
the power source is electrically coupled to and provides electric power to the solid state emitter,
the characteristic of the radiation is a radiation output level,
the controller is operatively coupled to the power source and the controller is configured to increase the power provided to the solid state emitter when the signal indicates that the radiation output level of the solid state emitter is below a first level and decrease the power provided to the solid state emitter when the signal indicates that the radiation output level is above a second level, and
the second level is greater than the first level.

3. The system of claim 1, further comprising a power source, wherein the power source is electrically coupled to and provides electric power to the solid state emitter, wherein the controller is operatively coupled to the power source, and wherein the controller is configured to control the solid state emitter at least in part by controlling the power source to control the power provided to the solid state emitter.

4. The system of claim 1 wherein the solid state emitter, the state device, and the support substrate form a single die, and wherein the support substrate is the only support substrate of the die.

5. The system of claim 1 wherein the state device is formed from a plurality of materials disposed conformally and sequentially on the solid state emitter.

6. The system of claim 1, further comprising an external surface through which radiation emitted by the active region passes, and wherein the state device is positioned off an optical axis between the active region and the external surface.

7. The system of claim 1, further comprising:
first and second state device contacts connected to the state device, the first and second emitter contacts being addressable separately from the state device contacts.

8. The system of claim 1, further comprising:
a third via extending through the substrate and having an electrically conductive material electrically coupled to the state device and defining a first state device contact at the second side of the substrate; and
a fourth via extending through the substrate and having an electrically conductive material electrically coupled to the state device and defining a second state device contact at the second side of the substrate.

9. A solid state transducer system, comprising:
a support substrate having a first side and a second side;
a solid state emitter carried by the support substrate over the first side of the support substrate, the solid state emitter comprising a first semiconductor component, a second semiconductor component, and an active region between the first and second semiconductor components;
a state device carried by the support substrate over the first side of the support substrate and positioned to detect a state of the solid state emitter, wherein the state device is formed from at least one state-sensing component having a composition different than that of the first semiconductor component, the second semiconductor component, and the active region, wherein the state device and the solid state emitter are stacked along a common axis, and wherein the state device includes a photosensor;
a reflective material positioned between the solid state emitter and the photosensor to reflect radiation emitted by the solid state emitter, wherein the reflective material includes an aperture positioned between the active region and the photosensor to pass radiation from the active region to the photosensor;
a first via extending through the substrate to the first semiconductor component of the solid state emitter, the first via having an electrically conductive material that defines a first emitter contact at the second side of the substrate;
a second via extending through the substrate to the second semiconductor component of the solid state emitter, the second via having an electrically conductive material that defines a second emitter contact at the second side of the substrate; and
a controller operatively coupled to the solid state emitter and the state device to receive a signal from the state device and control the solid state emitter based at least in part on the signal received from the state device.

10. The system of claim 9 wherein the reflective material is conductive.

\* \* \* \* \*